United States Patent
Kim et al.

(10) Patent No.: US 11,817,379 B2
(45) Date of Patent: Nov. 14, 2023

(54) SUBSTRATE COMPRISING AN INDUCTOR AND A CAPACITOR LOCATED IN AN ENCAPSULATION LAYER

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 494 days.

(21) Appl. No.: 16/927,823

(22) Filed: Jul. 13, 2020

(65) Prior Publication Data
US 2022/0013444 A1    Jan. 13, 2022

(51) Int. Cl.
*H05K 1/11* (2006.01)
*H05K 1/02* (2006.01)
(Continued)

(52) U.S. Cl.
CPC ....... *H01L 23/49822* (2013.01); *H03F 3/213* (2013.01); *H05K 1/111* (2013.01); *H05K 1/16* (2013.01); *H05K 1/181* (2013.01); *H05K 1/185* (2013.01); *H05K 1/0231* (2013.01); *H05K 1/0233* (2013.01)

(58) Field of Classification Search
CPC ......... H01L 23/49822; H01L 23/49811; H01L 2224/16227; H01L 2924/15311; H01L 2924/19041; H01L 2924/19042; H03F 3/213
See application file for complete search history.

(56) References Cited

U.S. PATENT DOCUMENTS 7,741,913 B2 * 6/2010 Block ................... H01P 1/2007
                                              330/307
7,978,031 B2 * 7/2011 Goi ...................... H05K 1/0206
                                              361/761
(Continued)

FOREIGN PATENT DOCUMENTS

WO    2019132926 A1    7/2019
WO    2019132941 A1    7/2019

OTHER PUBLICATIONS

International Search Report and Written Opinion—PCT/US2021/037003—ISA/EPO—dated Oct. 7, 2021.

*Primary Examiner* — Ishwarbhai B Patel
(74) *Attorney, Agent, or Firm* — Loza & Loza, LLP

(57) ABSTRACT

A package that includes a power amplifier and a substrate coupled to the power amplifier. The substrate includes an encapsulation layer, a capacitor device located in the encapsulation layer, an inductor located in the encapsulation layer, at least one first dielectric layer coupled to a first surface of the encapsulation layer, and a plurality of first interconnects coupled to the first surface of the encapsulation layer. The plurality of first interconnects is located at least in the at least one first dielectric layer. The plurality of first interconnects is coupled to the capacitor device and the inductor. The inductor and the capacitor device are configured to be electrically coupled together to operate as elements of a matching network for the power amplifier. The capacitor device is configured to be coupled to ground.

28 Claims, 25 Drawing Sheets

SIDE PROFILE VIEW

(51) Int. Cl.
*H05K 1/18* (2006.01)
*H01L 23/498* (2006.01)
*H03F 3/213* (2006.01)
*H05K 1/16* (2006.01)

(56) References Cited

U.S. PATENT DOCUMENTS

| | | |
|---|---|---|
| 8,653,626 B2 | 2/2014 | Lo et al. |
| 9,247,647 B1 | 1/2016 | Yoon et al. |
| 9,786,581 B2 | 10/2017 | Kamgaing |
| 10,433,425 B1 | 10/2019 | Liu et al. |
| 2015/0223319 A1* | 8/2015 | Muto ................. H03F 3/19 330/289 |
| 2017/0062120 A1 | 3/2017 | Yun et al. |
| 2019/0259695 A1 | 8/2019 | Gandhi et al. |
| 2020/0075491 A1* | 3/2020 | Dogiamis ......... H01L 23/49822 |
| 2020/0219861 A1* | 7/2020 | Kamgaing ........... H03H 9/0561 |

\* cited by examiner

SIDE PROFILE VIEW

*SIDE PROFILE VIEW*

SIDE PROFILE VIEW

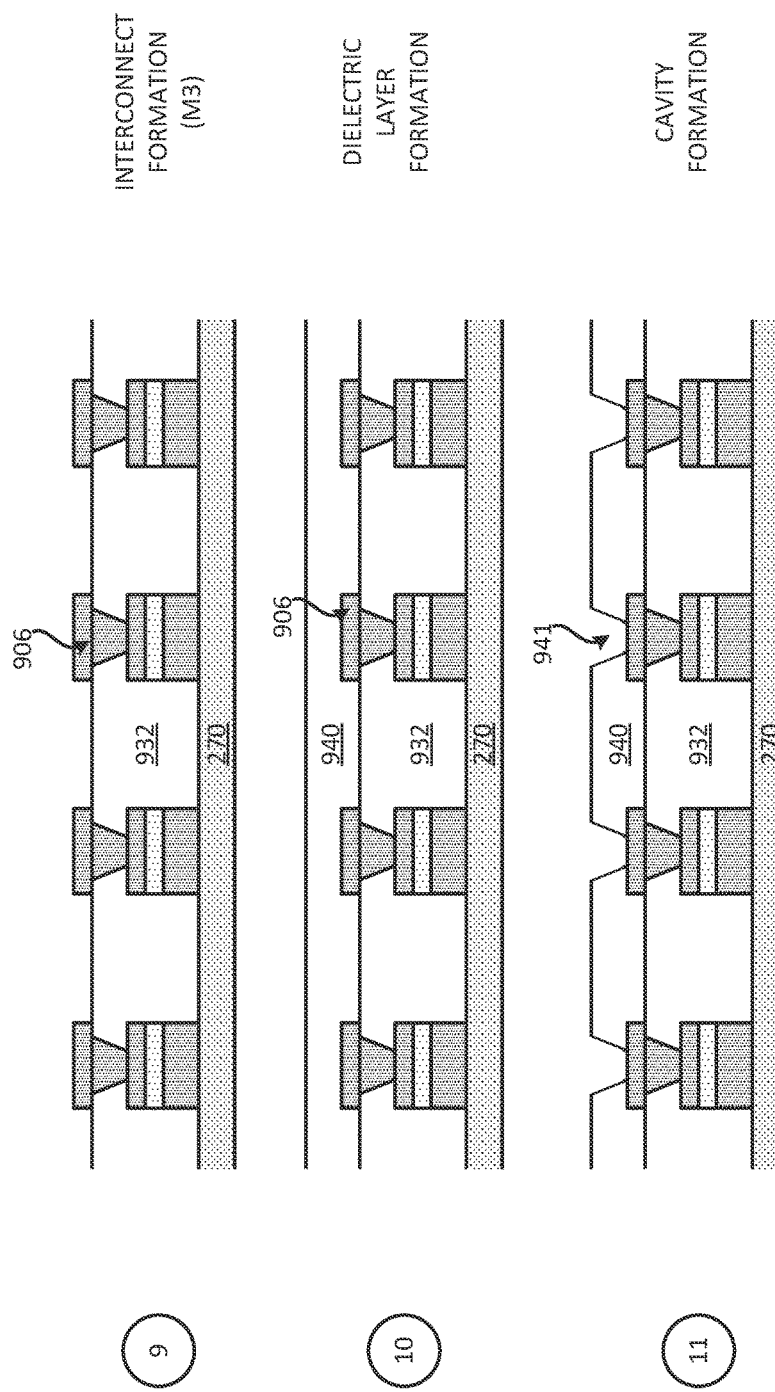

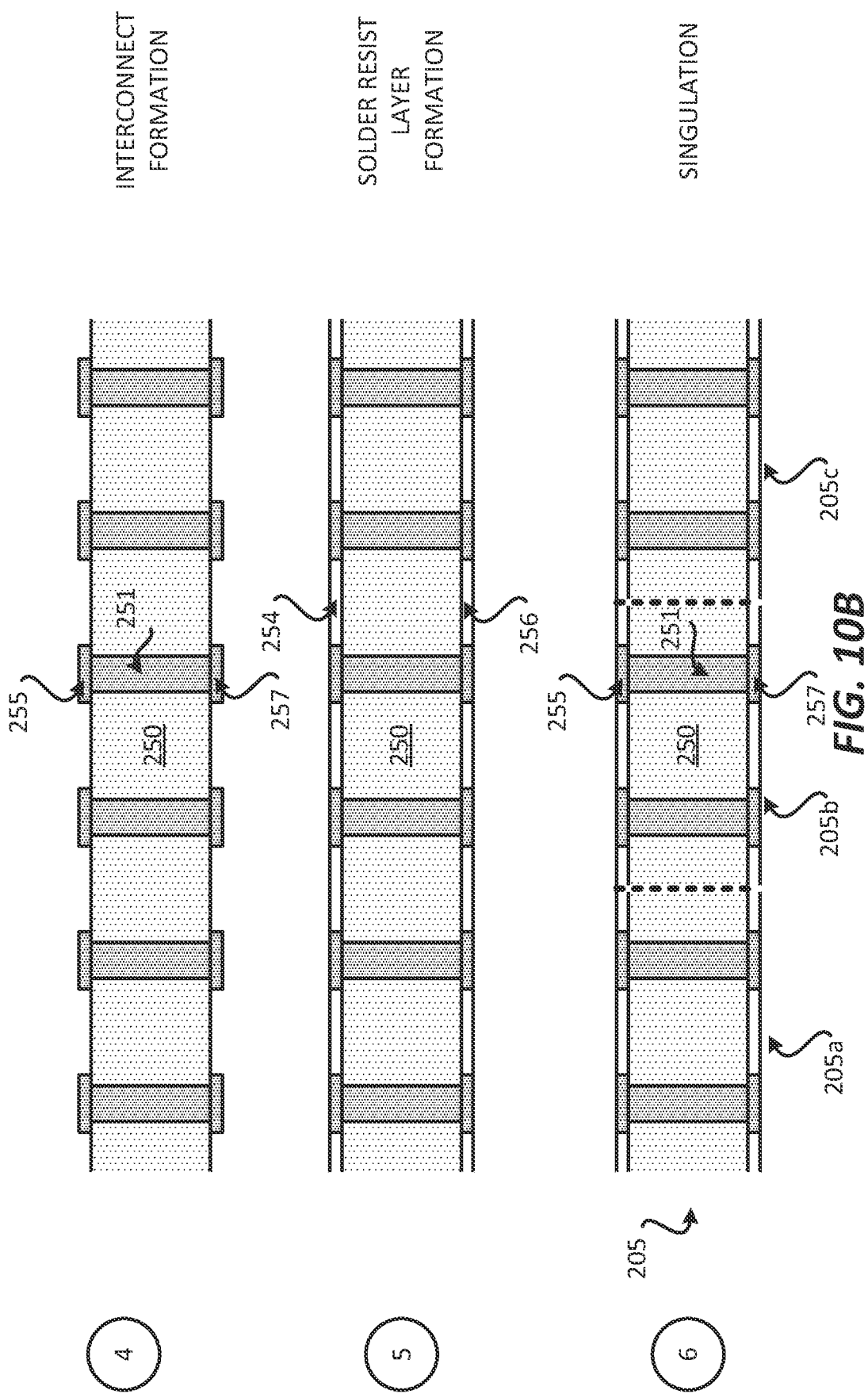

NB = NARROWBAND
BB = BROADBAND

SUBSTRATE COMPRISING AN INDUCTOR AND A CAPACITOR LOCATED IN AN ENCAPSULATION LAYER

FIELD

Various features relate to packages and substrates, but more specifically to substrates that include an inductor and a capacitor embedded in an encapsulation layer.

BACKGROUND

FIG. 1 illustrates a package 100 that includes a substrate 102, an integrated device 106, a capacitor 108, and an inductor 109. The integrated device 106 is coupled to a surface of the substrate 102. The capacitor 108 and the inductor 109 are coupled to the surface of the substrate 102. The capacitor 108 and the inductor 109 are each a discrete surface mounted device (SMD). The substrate 102 includes at least one dielectric layer 120 and a plurality of interconnects 122. A plurality of solder interconnects 130 is coupled to the substrate 102. The combination of the capacitor 108 and the inductor 109 can take up a lot of space and real estate. A small wireless device has space constraints and may not be able to accommodate many capacitors and/or inductors. Wireless devices may depend on many capacitors and/or inductors in order to provide efficient and effective wireless communication. The relatively big size of the surface mounted capacitors and inductors may limit the wireless performance of a small wireless device, since not as many surface mounted capacitors and inductors are going to be able to fit inside a small wireless device. There is an ongoing need to provide capacitors and inductors with better form factors and smaller sizes so that the capacitors and inductors may be implemented in smaller devices.

SUMMARY

Various features relate to packages and substrates, but more specifically to substrates that include an inductor and a capacitor embedded in an encapsulation layer.

One example provides a substrate that includes an encapsulation layer, a capacitor device located in the encapsulation layer, an inductor located in the encapsulation layer, at least one first dielectric layer coupled to a first surface of the encapsulation layer, and a plurality of first interconnects coupled to the first surface of the encapsulation layer. The plurality of first interconnects is located at least in the at least one first dielectric layer. The plurality of first interconnects is coupled to the capacitor device and the inductor.

Another example provides a package that includes a power amplifier and a substrate coupled to the power amplifier. The substrate includes an encapsulation layer, a capacitor device located in the encapsulation layer, an inductor located in the encapsulation layer, at least one first dielectric layer coupled to a first surface of the encapsulation layer, and a plurality of first interconnects coupled to the first surface of the encapsulation layer. The plurality of first interconnects is located at least in the at least one first dielectric layer. The plurality of first interconnects is coupled to the capacitor device and the inductor. The inductor and the capacitor device are configured to be electrically coupled together to operate as elements of a matching network for the power amplifier. The capacitor device is configured to be coupled to ground.

Another example provides an apparatus that includes means for encapsulation, means for capacitance located in the means for encapsulation, means for inductance located in the means for encapsulation, at least one first dielectric layer coupled to a first surface of the means for encapsulation, and a plurality of first interconnects coupled to the first surface of the means for encapsulation. The plurality of first interconnects is located at least in the at least one first dielectric layer. The plurality of first interconnects is coupled to the means for capacitance and the means for inductance.

Another example provides a method for fabricating a substrate. The method provides at least one capacitor device. The method provides at least one inductor device. The method forms an encapsulation layer that encapsulates the at least one capacitor device and the at least one inductor device. The method forms at least one first dielectric layer over a first surface of the encapsulation layer. The method forms a plurality of first interconnects over the first surface of the encapsulation layer. The plurality of first interconnects is located at least in the at least one first dielectric layer. The plurality of first interconnects is coupled to the capacitor device and the inductor device.

BRIEF DESCRIPTION OF THE DRAWINGS

Various features, nature and advantages may become apparent from the detailed description set forth below when taken in conjunction with the drawings in which like reference characters identify correspondingly throughout.

FIG. 9A-9D illustrate an exemplary sequence for fabricating a capacitor device.

FIG. 10A-10B illustrate an exemplary sequence for fabricating an inductor device.

DETAILED DESCRIPTION

Figure 1:
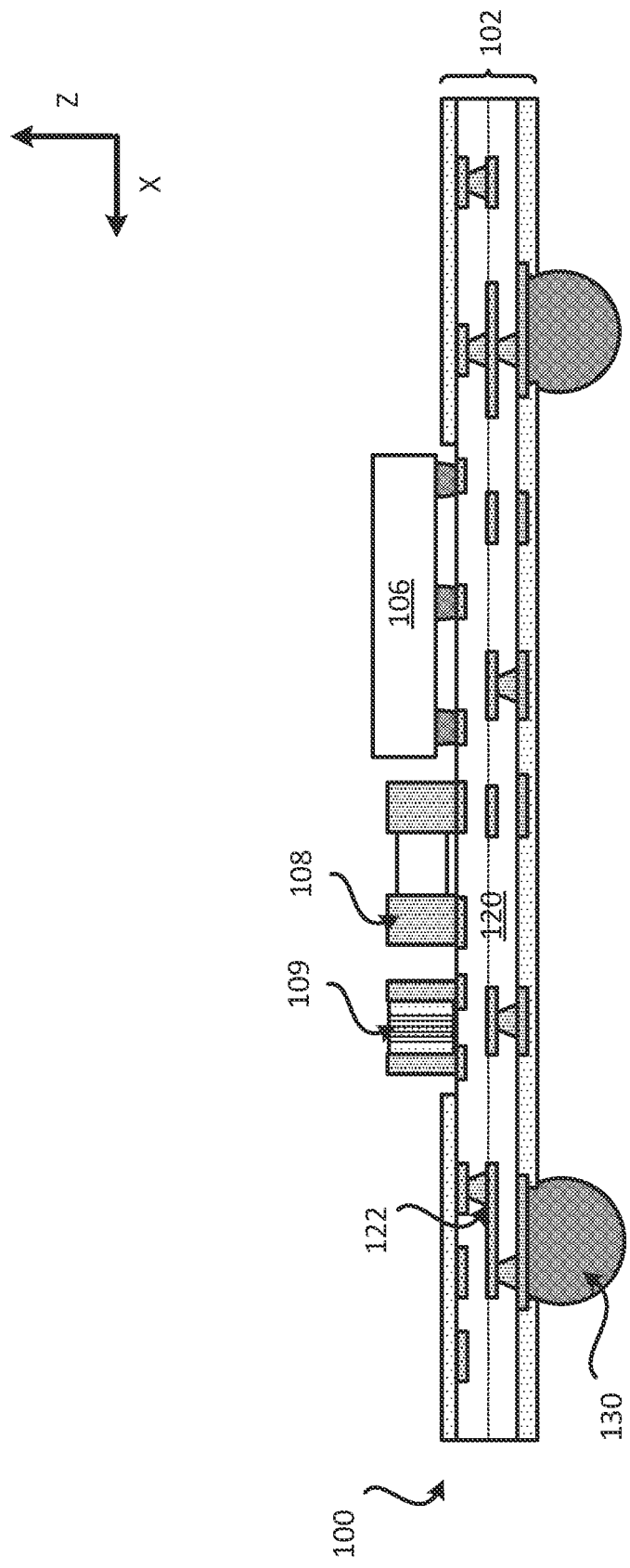
FIG. 1 illustrates a package that includes a surface mounted inductor and a surface mounted capacitor coupled to a substrate.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a power amplifier and a substrate coupled to the power amplifier. The substrate includes an encapsulation layer, a capacitor device located in the encapsulation layer, an inductor located in the encapsulation layer, at least one first dielectric layer coupled to a first surface of the encapsulation layer, and a plurality of first interconnects coupled to the first surface of the encapsulation layer. The plurality of first interconnects is located at least in the at least one first dielectric layer. The plurality of first interconnects is coupled to the capacitor device and the inductor. The substrate may include at least one second dielectric layer coupled to a second surface of the encapsulation layer, and at least one second interconnect coupled to the second surface of the encapsulation layer. The at least one second interconnect is located at least in the at least one second dielectric layer. The encapsulation layer may include a plurality of via interconnects. The inductor may be defined by some of the plurality of via interconnects and the least one first interconnect. The inductor may be part of an inductor device. The inductor device may include a dielectric layer, a plurality of via interconnects, and a plurality of interconnects. The inductor device may be embedded in the encapsulation layer. The capacitor device may include a metal-insulator-metal (MIM) capacitor. The capacitor device may be configured to be electrically coupled to the inductor. The inductor and the capacitor device are configured to be electrically coupled together to operate as elements of a matching network for the power amplifier (e.g., matching network between a power amplifier and an antenna). The capacitor device is configured to be coupled to ground. The design and/or configuration of the capacitor device(s) and the inductor(s) may provide a more compact form factor for the substrate, allowing more capacitors devices and/or inductors to be placed in a substrate. The ability to provide a substrate with several capacitor devices and/or inductors allows better impedance matching and thus provides better and improved signal filtering across a wider range of frequencies (e.g., broadband filtering). The design and configuration of the substrate with the capacitors and inductors, provides an overall better form factor and smaller size (while still providing effective performance capabilities) so that the substrate, the capacitors and the inductors may be implemented in smaller devices.

Figure 2:
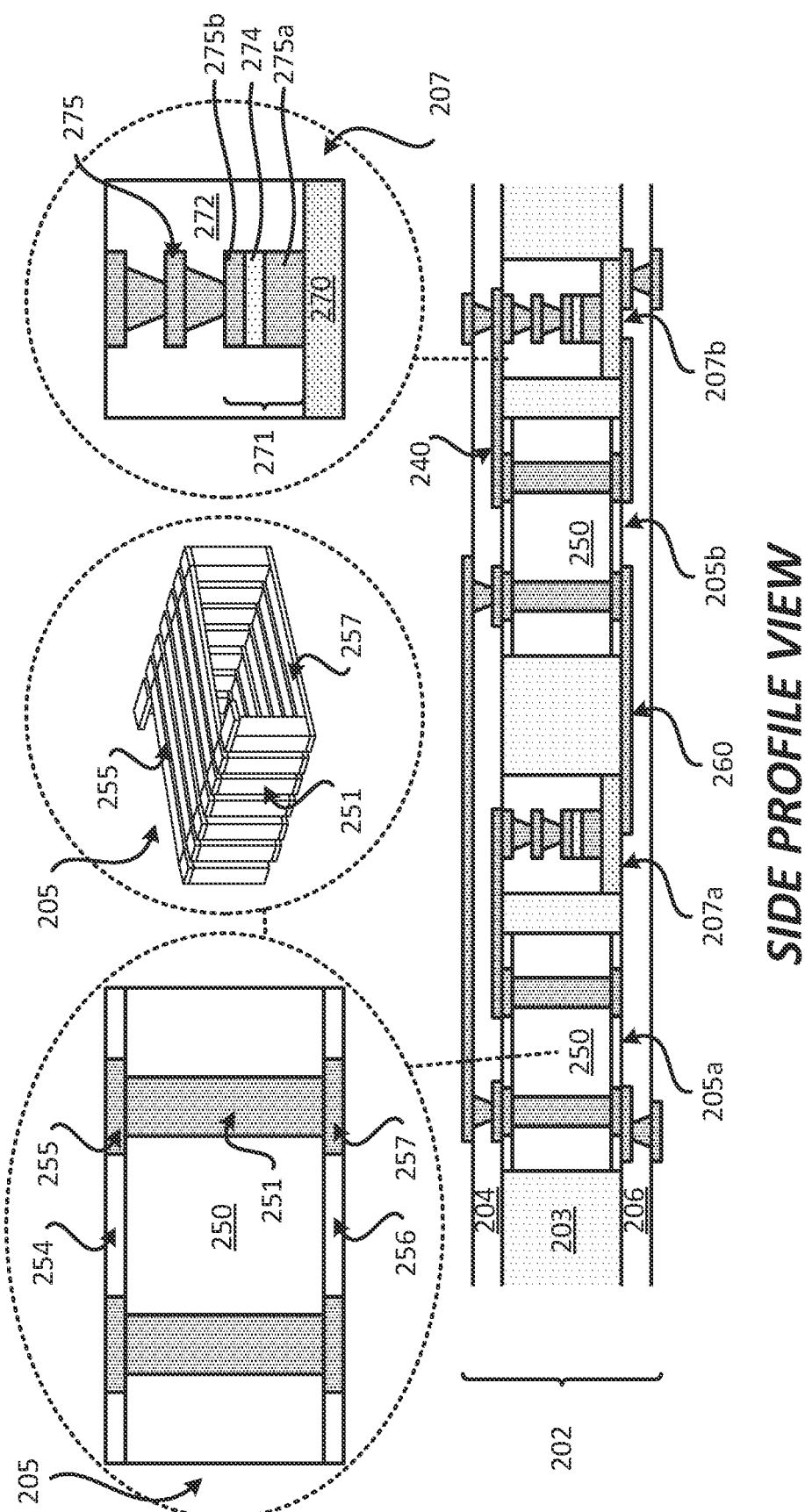
FIG. 2 illustrates a profile view of an exemplary substrate that includes a capacitor device and an inductor device.

Exemplary Packages and Substrates Comprising Inductor and Capacitor Embedded in an Encapsulation Layer FIG. 2 illustrates an example of a substrate 202 that includes an inductor and a capacitor embedded in an encapsulation layer. The substrate 202 includes an encapsulation layer 203, at least one inductor device 205, at least one capacitor device 207, at least one first dielectric layer 204, at least one second dielectric layer 206, a plurality of first interconnects 240, and a plurality of second interconnects 260.

The substrate 202 includes an inductor device 205a, an inductor device 205b, a capacitor device 207a and a capacitor device 207b. The inductor device 205a, the inductor device 205b, the capacitor device 207a and the capacitor device 207b are located in (e.g., laterally encapsulated by) the encapsulation layer 203. The encapsulation layer 203 may include a mold, a resin and/or an epoxy. The encapsulation layer 203 may be means for encapsulation.

The at least one first dielectric layer 204 is located over and coupled to a first surface of (i) the encapsulation layer 203, (ii) the inductor device 205a, (iii) the inductor device 205b, (iv) the capacitor device 207a, and (v) the capacitor device 207b. The at least one second dielectric layer 206 is located over and coupled to a second surface of (i) the encapsulation layer 203, (ii) the inductor device 205a, (iii) the inductor device 205b, (iv) the capacitor device 207a, and (v) the capacitor device 207b. The at least one first dielectric layer 204 and/or the at least one second dielectric layer 206 may include polyimide. Different implementations may include different dielectric layers for the at least one first dielectric layer 204 and/or the at least one second dielectric layer 206.

The plurality of first interconnects 240 is located in and over the at least one first dielectric layer 204. The plurality of first interconnects 240 may be coupled to the inductor device 205a, the inductor device 205b, the capacitor device 207a and/or the capacitor device 207b. The plurality of second interconnects 260 is located in and over the at least one second dielectric layer 206. The plurality of second interconnects 260 may be coupled to the inductor device 205a, the inductor device 205b, the capacitor device 207a and/or the capacitor device 207b.

The inductor device 205a and the inductor device 205b may each be represented by the inductor device 205. The inductor device 205 may be a means for inductance. The inductor device 205 includes a core layer 250, a plurality of interconnects 251, a plurality of interconnects 255, a plurality of interconnects 257, a dielectric layer 254 and a dielectric layer 256. The core layer 250 may include a dielectric layer. The core layer 250 may include a substrate. The core layer 250 may be an inductor core layer. The plurality of interconnects 251 (e.g., vias, via interconnects) travel through the core layer 250. The plurality of interconnects 251, the plurality of interconnects 255, and the plurality of interconnects 257 may define an inductor. The inductor may be configured as a solenoid inductor. The inductor device 205a and the inductor device 205b may have the same or different configurations (e.g., size, shape, number of turns, number of windings) to provide the same or different inductances.

The capacitor device 207a and the capacitor device 207b may each be represented by the capacitor device 207. The capacitor device 207 may be a means for capacitance. The capacitor device 207 includes a substrate 270, at least one dielectric layer 272, a plurality of interconnects 275 and an insulator layer 274. The substrate 270 may be a capacitor substrate. The plurality of interconnects 275 includes an interconnect 275a and an interconnect 275b. The capacitor device 207 includes a capacitor 271. The capacitor 271 may be a metal-insulator-metal (MIM) capacitor. The capacitor 271 may be defined by the interconnect 275a, the insulator layer 274 and the interconnect 275b. The insulator layer 274 is located between the interconnect 275a and the interconnect 275b. The insulator layer 274 may include a high k dielectric layer. For example, the insulator layer 274 may include silicon nitride (SiN). The capacitor device 207 may include several metal layers (e.g., M1, M2, M3, M4). The interconnect 275a may be on a first capacitor metal layer (M1) and the interconnect 275b may be on a second capacitor metal layer (M2). However, the metal layers of the capacitor 271 may be defined on any metal layer of the capacitor device 207. The capacitor 271 may be means for capacitance.

The inductor device 205a may be configured to be electrically coupled to the capacitor device 207a through the plurality of first interconnects 240 and/or the plurality of second interconnects 260. The inductor device 205b may be configured to be electrically coupled to the capacitor device 207b through the plurality of first interconnects 240 and/or the plurality of second interconnects 260. The inductor device 205a and the capacitor device 207a may be configured to be electrically coupled to the inductor device 205b and/or the capacitor device 207b through the plurality of first interconnects 240 and/or the plurality of second interconnects 260.

As will be further described below, the inductor device 205a, the inductor device 205b, the capacitor device 207a and/or the capacitor device 207b may be configured to operate as an output matching element(s) for a power amplifier (PA). The inductor device 205a, the inductor device 205b, the capacitor device 207a and/or the capacitor device 207b may be part of an output matching network for a power amplifier.

Figure 3:
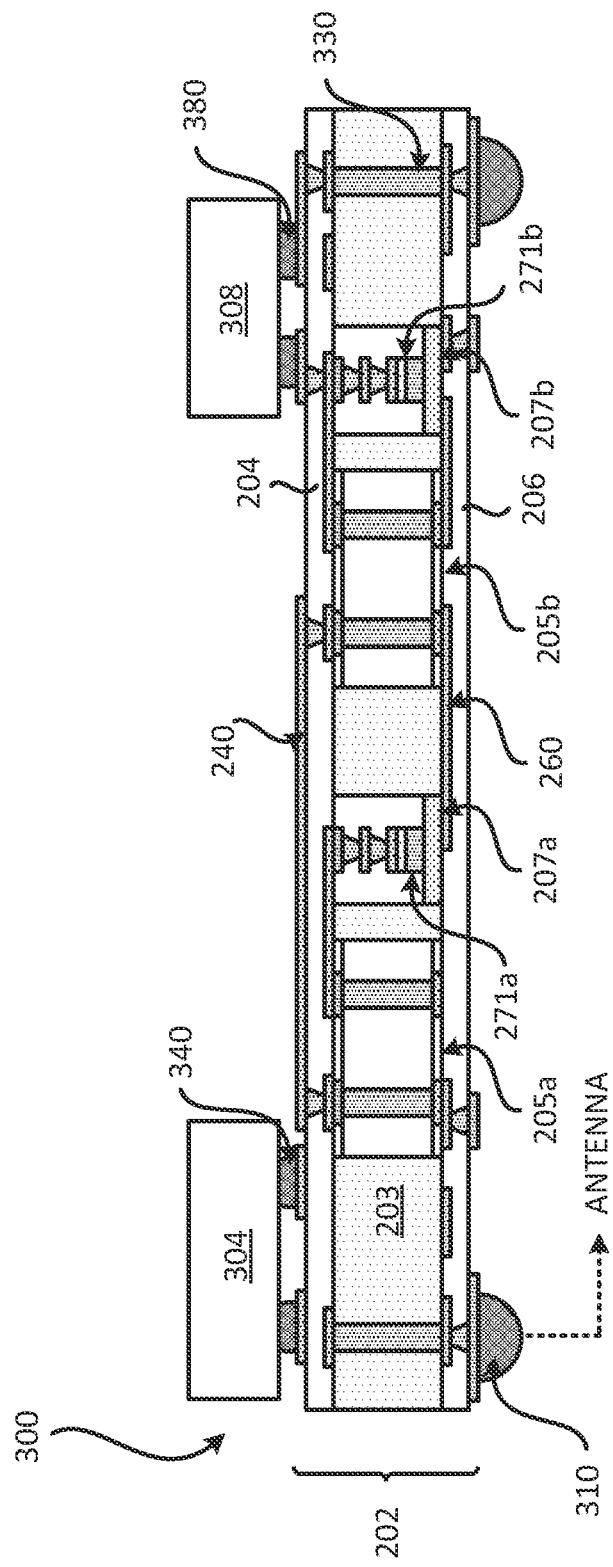
FIG. 3 illustrates a profile view of an exemplary package that includes a substrate implemented with a capacitor device and an inductor device.

FIG. 3 illustrates a package 300 that includes the substrate 202, a power amplifier (PA) 308 and an integrated device 304. The substrate 202 is similar to the substrate 202 described in FIG. 2. The substrate 202 includes the encapsulation layer 203, at least one first dielectric layer 204, at least one second dielectric layer 206, the plurality of first interconnects 240, the plurality of second interconnects 260, a plurality of interconnects 330, the inductor device 205a, the inductor device 205b, the capacitor device 207a, and the capacitor device 207b. The plurality of interconnects 330 (e.g., vias, via interconnects) travel through the encapsulation layer 203. The plurality of interconnects 330 is coupled to the plurality of interconnects 240 and the plurality of interconnects 260.

The power amplifier 308 is coupled to a first surface of the substrate 202 through a plurality of solder interconnects 380. The integrated device 304 is coupled to a first surface of the substrate 202 through a plurality of solder interconnects 340. The power amplifier 308 may be configured to amplify at least one electrical signal (e.g., electrical signal from at least one transmit path). The power amplifier 308 may be means for power amplification. In some implementations, the power amplifier 308 may be configured to be coupled to at least one antenna (e.g., through an output matching network). A plurality of solder interconnects 310 is coupled to a second surface of the substrate 202. The plurality of solder interconnects 310 may be coupled to the plurality of interconnects 260.

The power amplifier 308 is configured to be electrically coupled to the inductor device 205a, the capacitor device 207a, the inductor device 205b and the capacitor device 207b through the plurality of interconnects 240 and/or the plurality of interconnects 260. The inductor device 205a, the capacitor device 207a, the inductor device 205b and/or the capacitor device 207b may define an output matching network (e.g., for the power amplifier 308). Examples of various configurations of output matching networks are illustrated and described below in at least FIG. 16.

FIG. 3 illustrates that the capacitor devices 207a and 207b are located in (e.g., embedded in) the substrate 202 such that the capacitors (e.g., 271a, 271b) are located near a second surface (e.g., bottom surface) of the substrate 202. For example, the capacitors 271a and 271b are located near the at least one dielectric layer 206. The substrate 270 of the capacitor devices (e.g., 207a, 207b) may be coupled to the at least one dielectric layer 206. In some implementations, the capacitor devices may be located in the substrate differently.

Figure 4:
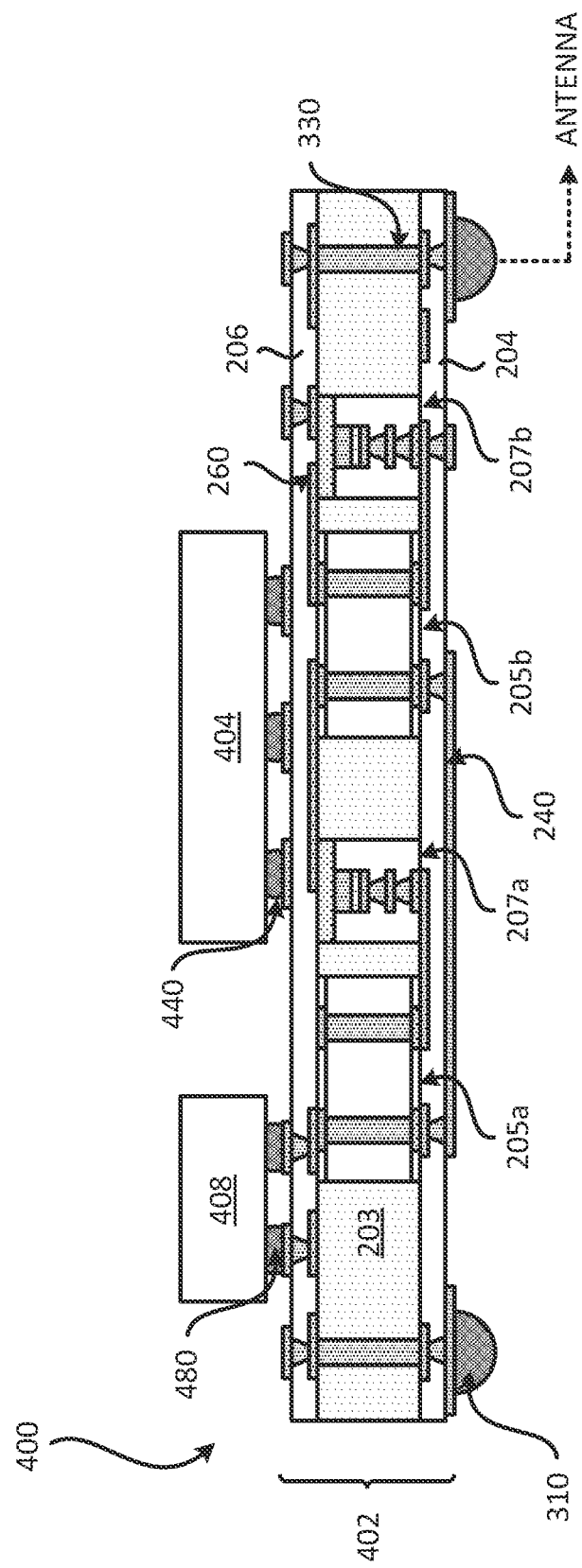
FIG. 4 illustrates a profile view of an exemplary package that includes a substrate implemented with a capacitor device and an inductor device.

FIG. 4 illustrates a package 400 that includes a substrate 402, a power amplifier (PA) 408 and an integrated device 404. The substrate 402 includes the encapsulation layer 203, at least one first dielectric layer 204, at least one second dielectric layer 206, the plurality of first interconnects 240, the plurality of second interconnects 260, a plurality of interconnects 330, the inductor device 205a, the inductor device 205b, the capacitor device 207a, and the capacitor device 207b. The plurality of interconnects 330 (e.g., vias, via interconnects) travel through the encapsulation layer 203. The plurality of interconnects 330 is coupled to the plurality of interconnects 240 and the plurality of interconnects 260. The substrate 402 is similar to the substrate 202 described in FIGS. 2 and 3, and thus includes similar components as the substrate 202 of FIGS. 2 and 3. However, in FIG. 4, the capacitor devices 207a and 207b are located in (e.g., embedded in) the substrate 402 such that the capacitors (e.g., 271a, 271b) are located near a first surface (e.g., top surface) of the substrate 402. For example, the capacitors 271a and 271b are located near the integrated device 404. The substrate 270 of the capacitor devices (e.g., 207a, 207b) may be coupled to the at least one dielectric layer 206. Thus, in FIG. 4, the capacitor devices are vertically flipped compared to the capacitor devices shown in FIGS. 2 and 3. Thus, in some implementations, the capacitor devices may be located upright and/or upside down in a substrate.

The power amplifier 408 is coupled to a first surface of the substrate 402 through a plurality of solder interconnects 480. The integrated device 404 is coupled to a first surface of the substrate 402 through a plurality of solder interconnects 440. The power amplifier 408 may be configured to amplify at least one electrical signal (e.g., electrical signal from at least one transmit path). The power amplifier 408 may be means for power amplification. In some implementations, the power amplifier 408 may be configured to be coupled to at least one antenna (e.g., through an output matching network). An output matching network for the power amplifier 408 may include the inductor device 205a, the capacitor device 207a, the inductor device 205b and/or the capacitor device 207b.

Figure 5:
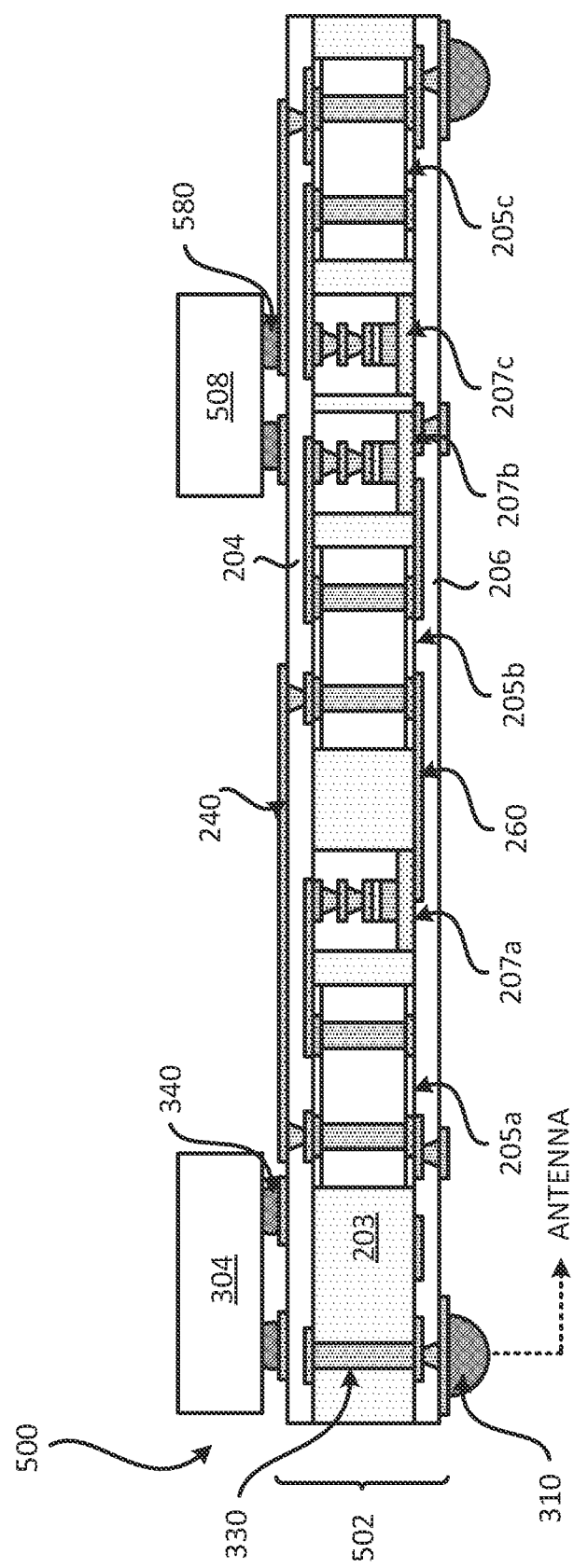
FIG. 5 illustrates a profile view of an exemplary package that includes a substrate implemented with a capacitor device and an inductor device.

FIG. 5 illustrates a package 500 that includes the substrate 502, a power amplifier (PA) 508 and the integrated device 304. The substrate 502 is similar to the substrate 202 described in FIGS. 2 and 3, and thus includes similar components as the substrate 202 of FIGS. 2 and 3. In FIG. 5, the power amplifier is configured to be electrically coupled to more inductors and capacitors. The substrate 502 includes the encapsulation layer 203, at least one first dielectric layer 204, at least one second dielectric layer 206, the plurality of first interconnects 240, the plurality of second interconnects 260, a plurality of interconnects 330, the inductor device 205a, the inductor device 205b, an inductor device 205c, the capacitor device 207a, the capacitor device 207b, and a capacitor device 207c. The plurality of interconnects 330 (e.g., vias, via interconnects) travel through the encapsulation layer 203. The plurality of interconnects 330 is coupled to the plurality of interconnects 240 and the plurality of interconnects 260. The plurality of interconnects 330, the inductor device 205a, the inductor device 205b, the inductor device 205c, the capacitor device 207a, the capacitor device 207b, and the capacitor device 207c are located in the encapsulation layer 203.

The power amplifier 508 is coupled to a first surface of the substrate 502 through a plurality of solder interconnects 580. The integrated device 304 is coupled to a first surface of the substrate 502 through a plurality of solder interconnects 340. The power amplifier 508 may be configured to amplify at least one electrical signal (e.g., electrical signal from at least one transmit path). The power amplifier 508 may be means for power amplification. In some implementations, the power amplifier 508 may be configured to be coupled to at least one antenna (e.g., through an output matching network). A plurality of solder interconnects 310 is coupled to a second surface of the substrate 502. The plurality of solder interconnects 310 may be coupled to the plurality of interconnects 260.

The power amplifier 508 is configured to be electrically coupled to the inductor device 205c, the capacitor device 207c, the inductor device 205b, the capacitor device 207b, the inductor device 205a and the capacitor device 207a through the plurality of interconnects 240 and/or the plurality of interconnects 260. The inductor device 205a, the capacitor device 207a, the inductor device 205b, the capacitor device 207b, the inductor device 205c and/or the capacitor device 207c may define an output matching network (e.g., for the power amplifier 508). Examples of various output matching networks are illustrated and described below in at least FIG. 16. As will be further described the increasing the number of inductors and/or capacitors in an output matching network may help provide better impedance matching over a greater range of frequencies.

Figure 6:
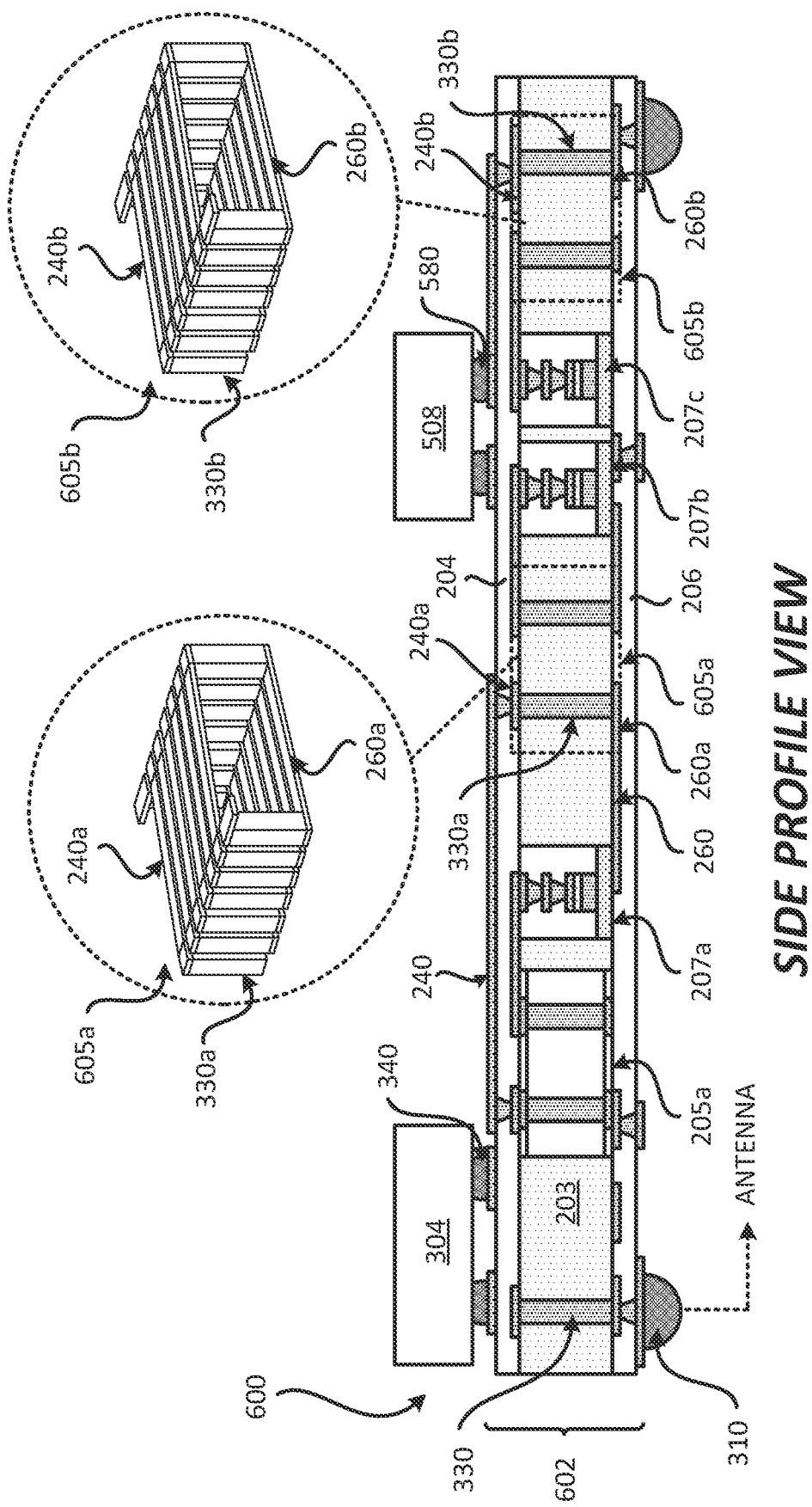
FIG. 6 illustrates a profile view of an exemplary package that includes a substrate implemented with a capacitor device and an inductor.

In some implementations, at least one inductor may be implemented in an encapsulation layer of the substrate. FIG. 6 illustrates a package 600 that includes the power amplifier 508, an integrated device 304 and the substrate 602. The substrate 602 is similar to the substrate 202 described in FIGS. 2 and 3, and thus includes similar components as the substrate 202 of FIGS. 2 and 3. In FIG. 6, the power amplifier is configured to be electrically coupled to more inductors and capacitors. The substrate 602 also includes at least one inductor that is formed by interconnects in and over the encapsulation layer.

The substrate 602 includes the encapsulation layer 203, at least one first dielectric layer 204, at least one second dielectric layer 206, the plurality of first interconnects 240, the plurality of second interconnects 260, a plurality of interconnects 330, the inductor device 205a, an inductor 605a, an inductor 605b, the capacitor device 207a, the capacitor device 207b, and the capacitor device 207c. The plurality of interconnects 330 (e.g., vias, via interconnects) travel through the encapsulation layer 203. The plurality of interconnects 330 is coupled to the plurality of interconnects 240 and the plurality of interconnects 260. The plurality of interconnects 330, the inductor device 205a, the inductor 605a, the inductor 605b, the capacitor device 207a, the capacitor device 207b, and the capacitor device 207c are located in the encapsulation layer 203. The plurality of first interconnects 240 and/or the plurality of second interconnects 260 may include redistribution interconnects. The plurality of first interconnects 240 and/or the plurality of second interconnects 260 may be fabricated using a redistribution layer (RDL) fabrication process.

As shown in FIG. 6, some of the interconnects from the plurality of interconnects 330, the plurality of interconnects 240 and the plurality of interconnects 260 may be configured to operate as at least one inductor. For example, the inductor 605a may be defined by the plurality of interconnects 330a, the plurality of interconnects 240a and the plurality of interconnects 260a. Similarly, the inductor 605b may be defined by the plurality of interconnects 330b, the plurality of interconnects 240b and the plurality of interconnects 260b. The inductor (e.g., 605a, 605b) may be a solenoid inductor. The inductor (e.g., 605a, 605b) may be a means for inductance.

The power amplifier 508 is coupled to a first surface of the substrate 602 through a plurality of solder interconnects 580. The integrated device 304 is coupled to a first surface of the substrate 602 through a plurality of solder interconnects 340. The power amplifier 508 may be configured to amplify at least one electrical signal (e.g., electrical signal from at least one transmit path). The power amplifier 508 may be means for power amplification. In some implementations, the power amplifier 508 may be configured to be coupled to at least one antenna (e.g., through an output matching network). A plurality of solder interconnects 310 is coupled to a second surface of the substrate 502. The plurality of solder interconnects 310 may be coupled to the plurality of interconnects 260.

The power amplifier 508 is configured to be electrically coupled to the inductor 605b, the capacitor device 207c, the inductor 605a, the capacitor device 207b, the inductor device 205a and the capacitor device 207a through the plurality of interconnects 240 and/or the plurality of interconnects 260. The inductor 605b, the capacitor device 207a, the inductor 605a, the capacitor device 207b, the inductor device 205a and/or the capacitor device 207a may define an output matching network (e.g., for the power amplifier 508). Examples of various output matching networks are illustrated and described below in at least FIG. 16. As will be further described the increasing the number of inductors and/or capacitors in an output matching network may help provide better impedance matching over a greater range of frequencies.

The various capacitors and inductors (and combinations thereof) described in the disclosure may be configured to operate as an output matching element (and/or output matching network) for a power amplifier. The output matching network that is provided by the capacitor(s) and/or inductor(s) (e.g., output matching element) may be impedance matching that helps match the output impedance of a power amplifier to an input load to another component (e.g., integrated device, die) so as to maximize energy transfer between the power amplifier and the other component. The combination of a capacitor and an inductor may be configured to operate as an LC resonator, a resonant trap and/or an output matching element for the power amplifier. As will be further described below in at least FIG. 16, an output matching network may have different orders (e.g., $1^{st}$ order output matching network, $2^{nd}$ order output matching network, $3^{rd}$ order output matching network). It is noted that capacitor(s) and/or inductor(s) may be one of many elements of an output matching network. Thus, an output matching network may include other elements beyond the capacitor(s) and/or inductor(s).

An integrated device (e.g., 304, 404) may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a Silicon (Si) based integrated device, a silicon carbide (SiC) based integrated device, a GaAs based integrated device, a GaN based integrated device, a memory, power management processor, and/or combinations thereof.

The packages (e.g., 300, 400, 500, 600) described in the disclosure may be a radio frequency (RF) package. The packages (e.g., 300, 400, 500, 600) may be part of a radio frequency front end (RFFE) package. The packages (e.g., 300, 400, 500, 600) may be configured to provide Wireless Fidelity (WiFi) communication and/or cellular communication (e.g., 2G, 3G, 4G, 5G). The packages (e.g., 300, 400, 500, 600) may be configured to support Global System for Mobile Communications (GSM), Universal Mobile Telecommunications System (UMTS), and/or Long-Term Evolution (LTE).

Figure 7:
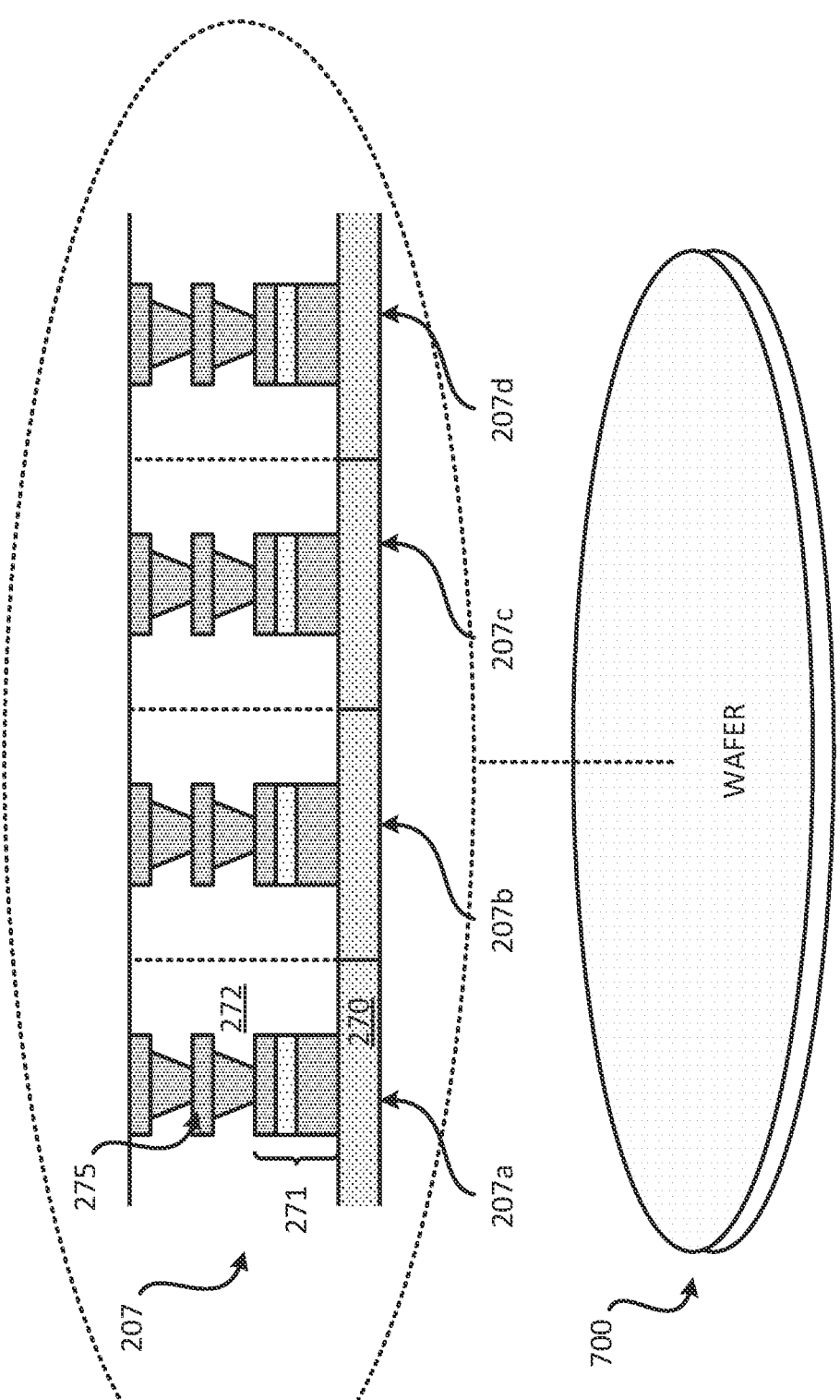
FIG. 7 illustrates an exemplary wafer that includes a plurality of capacitor devices.
Figure 8:
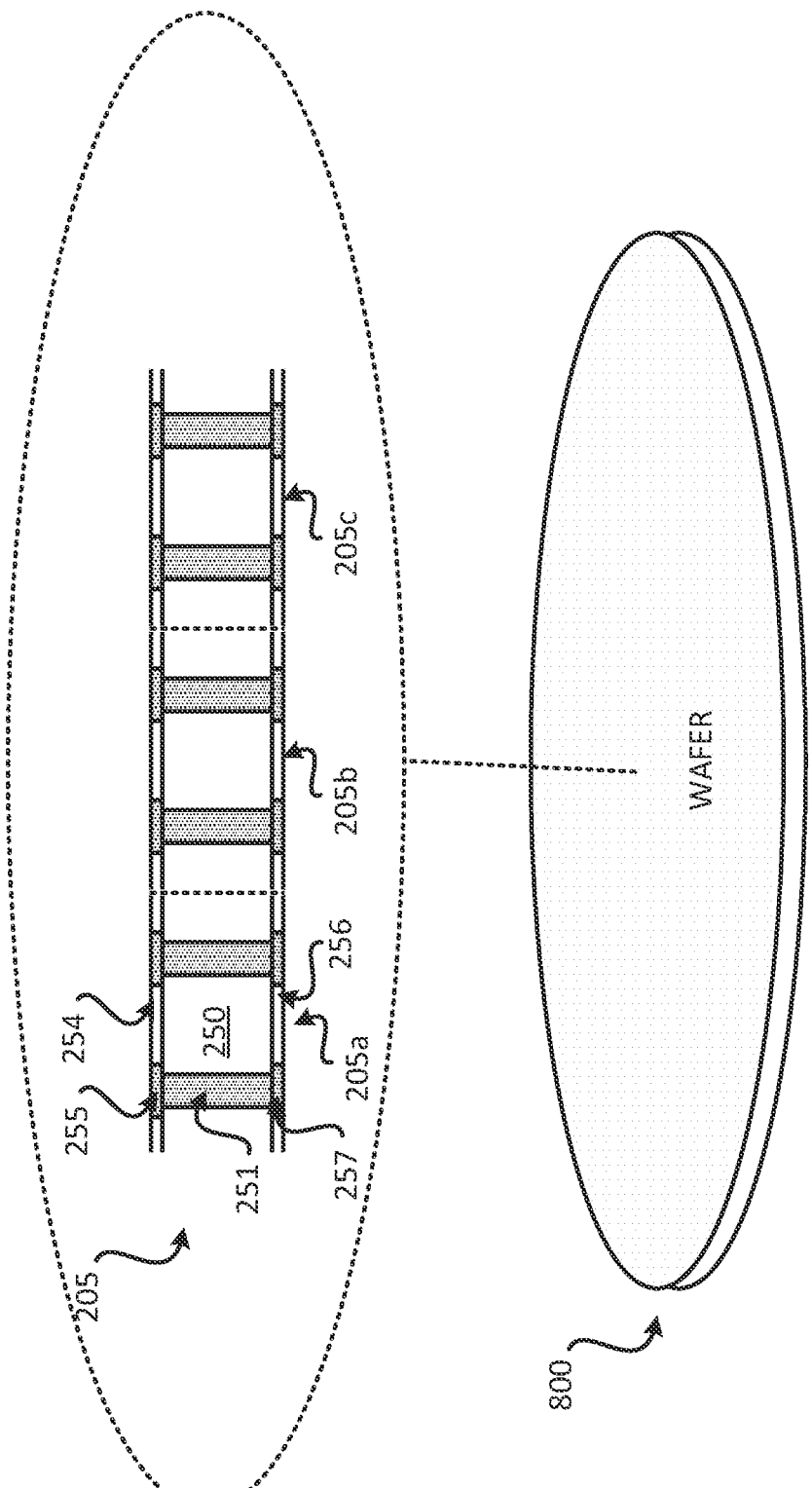
FIG. 8 illustrates an exemplary wafer that includes a plurality of inductor devices.

The packages (e.g., 300, 400, 500, 600) described in the disclosure may be coupled to a board (e.g., printed circuit board (PCB)) through a plurality of solder interconnects. The substrate(s) (e.g., 202, 402, 502, 602) may be configured as an interposer between the integrated devices and a board (e.g., PCB). The substrate(s) (e.g., 202, 402, 502, 602) may be include one or more dielectric layers (e.g., 204, 206) and one or more metal layers that define the interconnects 240 and/or the interconnects 260. The capacitors devices (e.g., 207a, 207b, 207c), inductor devices (e.g., 205a, 205b, 205c) and/or inductors (e.g., 605a, 605b) may be configured to be electrically coupled together to operate as elements of a matching network between a power amplifier and an antenna. Some or all of the capacitor devices (e.g., 207a, 207b, 207c), inductor devices (e.g., 205a, 205b, 205c) and/or inductors (e.g., 605a, 605b) may be configured to be coupled to ground. The capacitor devices and inductor devices described in the disclosure may be fabricated as part of a wafer. The wafer is singulated to form individual capacitor devices or individual inductor devices. FIGS. 7 and 8 illustrate exemplary wafers with respective capacitor devices and inductors devices.

FIG. 7 illustrates a wafer 700 that includes a plurality of capacitor devices 207 (e.g., 207a, 207b, 207c, 207d). Each capacitor device includes a substrate 270, at least one dielectric layer 272, a plurality of interconnects 275 and an insulator layer 274. Each capacitor device includes a capacitor 271. The capacitor 271 may be a metal-insulator-metal (MIM) capacitor.

FIG. 8 illustrates a wafer 800 that includes a plurality of inductor devices 205 (e.g., 205a, 205b, 205c). Each of the inductor device includes a core layer 250, a plurality of interconnects 251, a plurality of interconnects 255, a plurality of interconnects 257, a dielectric layer 254 and a dielectric layer 256. The core layer 250 may include a dielectric layer. The core layer 250 may include a substrate (e.g., silicon (Si)). The plurality of interconnects 251 (e.g., vias) travel through the core layer 250. The plurality of interconnects 251, the plurality of interconnects 255, and the plurality of interconnects 257 may define an inductor. The inductor may be configured as a solenoid inductor.

Having described wafers that respectively include a plurality of capacitor devices or a plurality of inductor devices, processes for fabricating capacitor devices and inductor devices will now be described below.

Exemplary Sequence for Fabricating a Capacitor Device

In some implementations, fabricating a capacitor device includes several processes. FIGS. 9A-9D illustrate an exemplary sequence for providing or fabricating a capacitor device. In some implementations, the sequence of FIGS. 9A-9D may be used to provide or fabricate the capacitor device 207. However, the process of FIGS. 9A-9D may be used to fabricate any of the capacitor devices described in the disclosure.

It should be noted that the sequence of FIGS. 9A-9D may combine one or more stages in order to simplify and/or clarify the sequence for providing or fabricating a capacitor device. In some implementations, the order of the processes may be changed or modified. In some implementations, one or more of processes may be replaced or substituted without departing from the spirit of the disclosure.

Figure 9A:
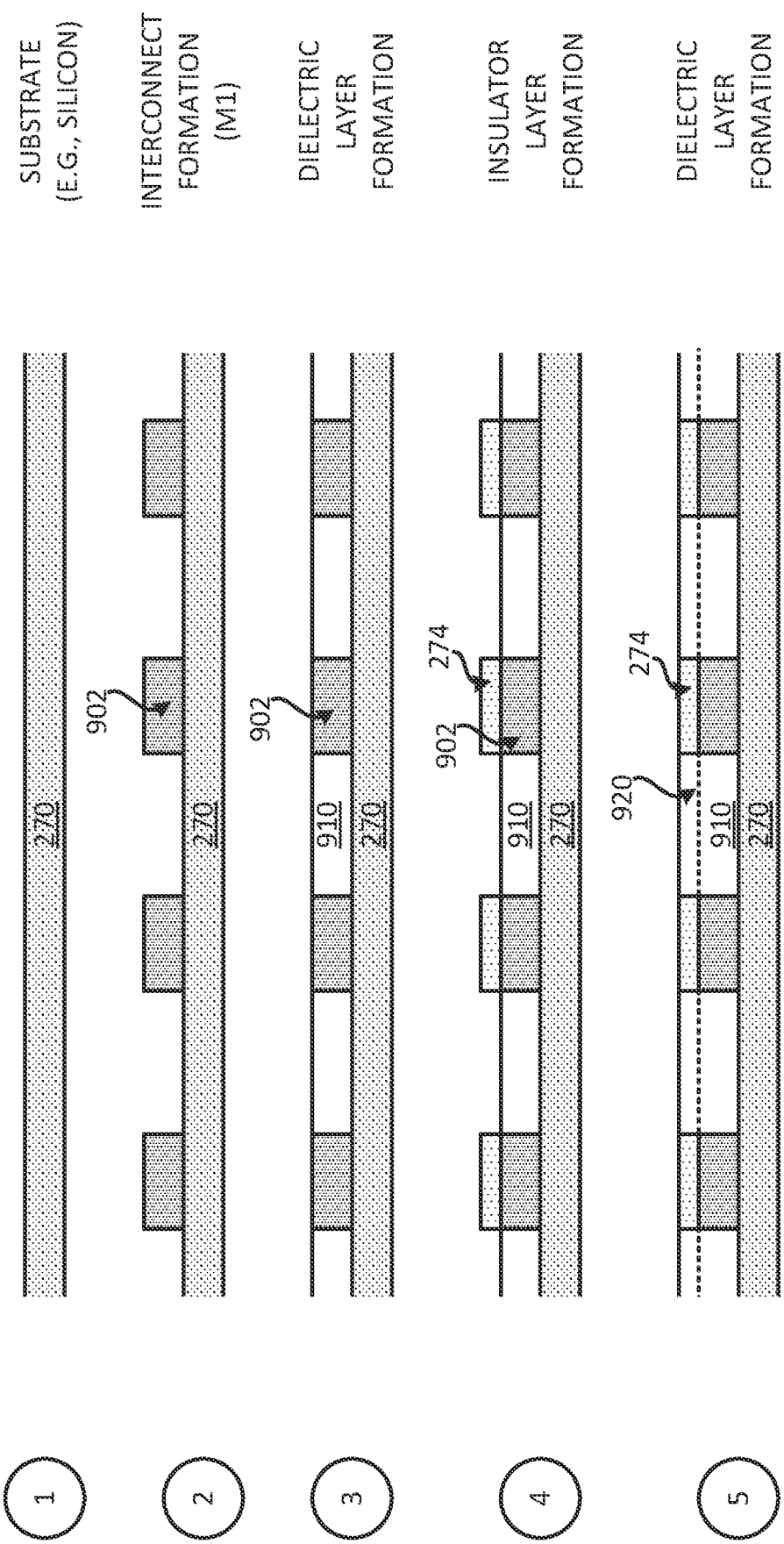

Stage 1, as shown in FIG. 9A, illustrates a state after a substrate 270 is provided. The substrate 270 may include silicon (Si). The substrate 270 may be provided as a wafer.

Stage 2 illustrates a state after a plurality of interconnects 902 is formed. A patterning process and a plating process may be used to form the interconnects 902 over a surface of the substrate 270. The interconnects 902 may be on a first capacitor metal layer (M1). The interconnects 902 may represent the interconnect 275a, as described in FIG. 2.

Stage 3 illustrates a state after a dielectric layer 910 is formed over a surface of the substrate 270. A deposition process may be used to form the dielectric layer 910. The dielectric layer 910 may include polyimide. However, different implementations may use different materials for the dielectric layer 910.

Stage 4 illustrates a state after an insulator layer 274 is formed over the interconnect 902. A deposition process may be used to form the insulator layer 274 over the interconnect 902. The insulator layer 274 may include a high K dielectric layer, such as silicon nitride (SiN). However, different implementations may use different materials for the insulator layer 274.

Stage 5 illustrates a state after a dielectric layer 920 is formed over a surface of the dielectric layer 910. A deposition process may be used to form the dielectric layer 920. The dielectric layer 920 may be similar or the same as the dielectric layer 910. The dielectric layer 920 may include polyimide. However, different implementations may use different materials for the dielectric layer 920.

Figure 9B:
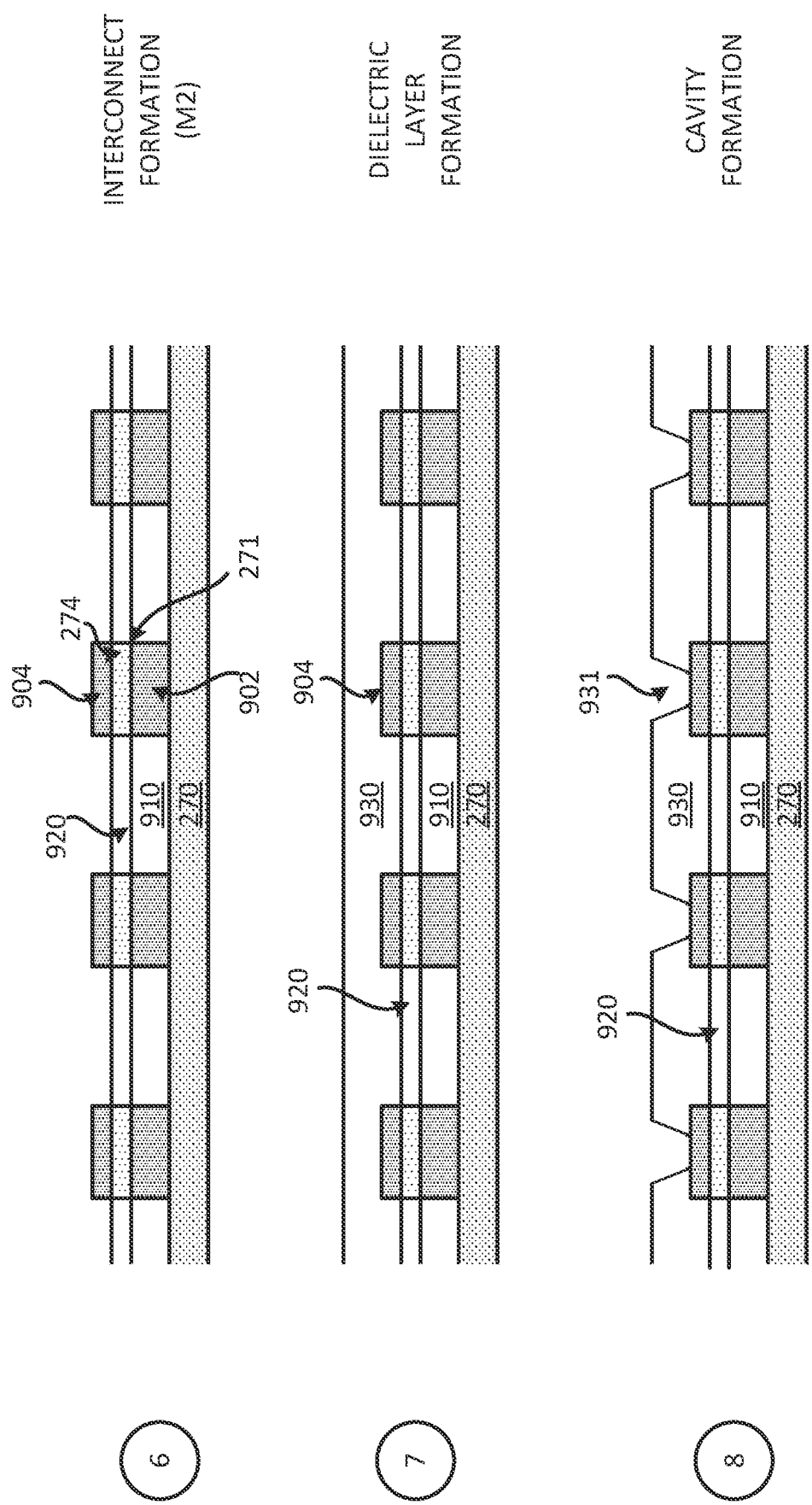

Stage 6, as shown in FIG. 9B, illustrates a state after a plurality of interconnects 904 is formed. A patterning process and a plating process may be used to form the interconnects 904 over the insulator layer 274. The interconnects 904 may on a second capacitor metal layer (M2). The interconnects 904 may represent the interconnect 275b, as described in FIG. 2. Stage 6 may illustrate a capacitor 271 that is defined by the interconnect 902, the insulator layer 274 and the interconnect 904.

Stage 7 illustrates a state after a dielectric layer 930 is formed over the dielectric layer 920 and the interconnects 904. A deposition process may be used to form the dielectric layer 930. The dielectric layer 930 may be similar or the same as the dielectric layer 920. The dielectric layer 930 may include polyimide. However, different implementations may use different materials for the dielectric layer 930.

Stage 8 illustrates after a plurality of cavities 931 is formed in the dielectric layer 930. A laser process (e.g., laser ablation), a lithography process (e.g., exposure and development), or an etching process may be used to form the cavities 931.

Stage 9, as shown in FIG. 9C, illustrates a state after a plurality of interconnects 906 is formed in and/or over the dielectric layer 932. The dielectric layer 932 may represent the dielectric layers 910, 920 and/or 930. A patterning process and a plating process may be used to form the interconnects 906. The interconnects 906 may be formed in the cavities 931. The interconnects 906 may include vias, pads and/or traces. Some of the interconnects from the plurality of interconnects 906 may be formed on a third metal layer (M3).

Stage 10 illustrates a state after a dielectric layer 940 is formed over the dielectric layer 932 and the interconnects 906. A deposition process may be used to form the dielectric layer 940. The dielectric layer 940 may be similar or the same as the dielectric layer 932. The dielectric layer 940 may include polyimide. However, different implementations may use different materials for the dielectric layer 940.

Stage 11 illustrates after a plurality of cavities 941 is formed in the dielectric layer 940. A laser process (e.g., laser ablation), a lithography process (e.g., exposure and development), or an etching process may be used to form the cavities 941.

Figure 9D:
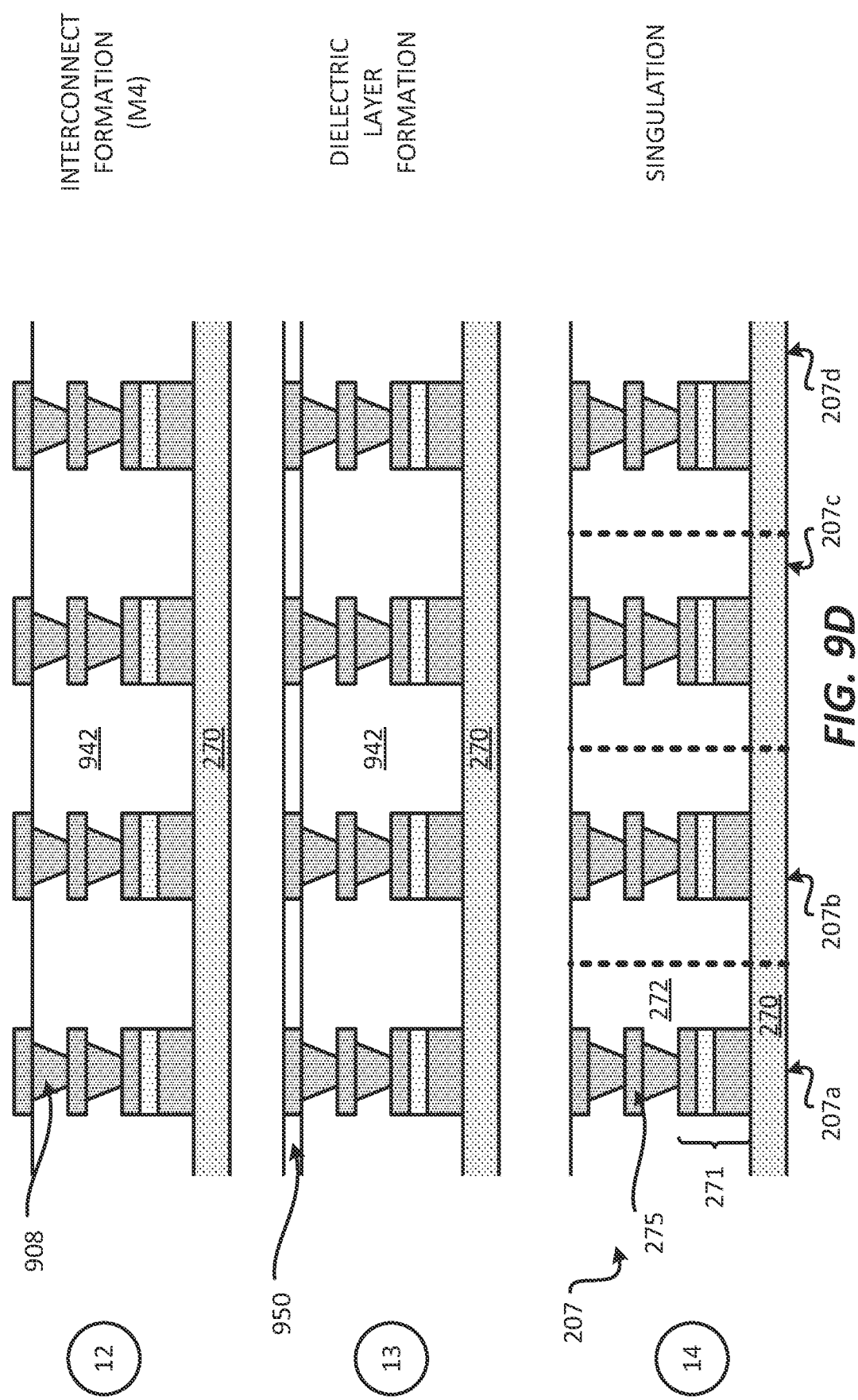

Stage 12, as shown in FIG. 9D, illustrates a state after a plurality of interconnects 908 is formed in and/or over the dielectric layer 942. The dielectric layer 942 may represent the dielectric layers 910, 920, 930, 932 and/or 940. A patterning process and a plating process may be used to form the interconnects 908. The interconnects 908 may be formed in the cavities 941. The interconnects 908 may include vias, pads and/or traces. Some of the interconnects from the plurality of interconnects 908 may be formed on a fourth metal layer (M4).

Stage 13 illustrates a state after a dielectric layer 950 is formed over the dielectric layer 942 and the interconnects 908. A deposition process may be used to form the dielectric layer 950. The dielectric layer 950 may be similar or the same as the dielectric layer 942. The dielectric layer 950 may include polyimide. However, different implementations may use different materials for the dielectric layer 950.

Stage 14 illustrates a state after singulation of a wafer to form a plurality of capacitor devices 207 (e.g., 207a, 207b, 207c, 207d). Each capacitor device 207 includes a substrate 270, at least one dielectric layer 272, a plurality of interconnects 275 and an insulator layer 274. The at least one dielectric layer 272 may represent the dielectric layers 942 and/or 950. Each capacitor device includes a capacitor 271. The capacitor 271 may be a metal-insulator-metal (MIM) capacitor.

Different implementations may use different processes for forming the interconnects and/or metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Sequence for Fabricating an Inductor Device

Figure 10A:
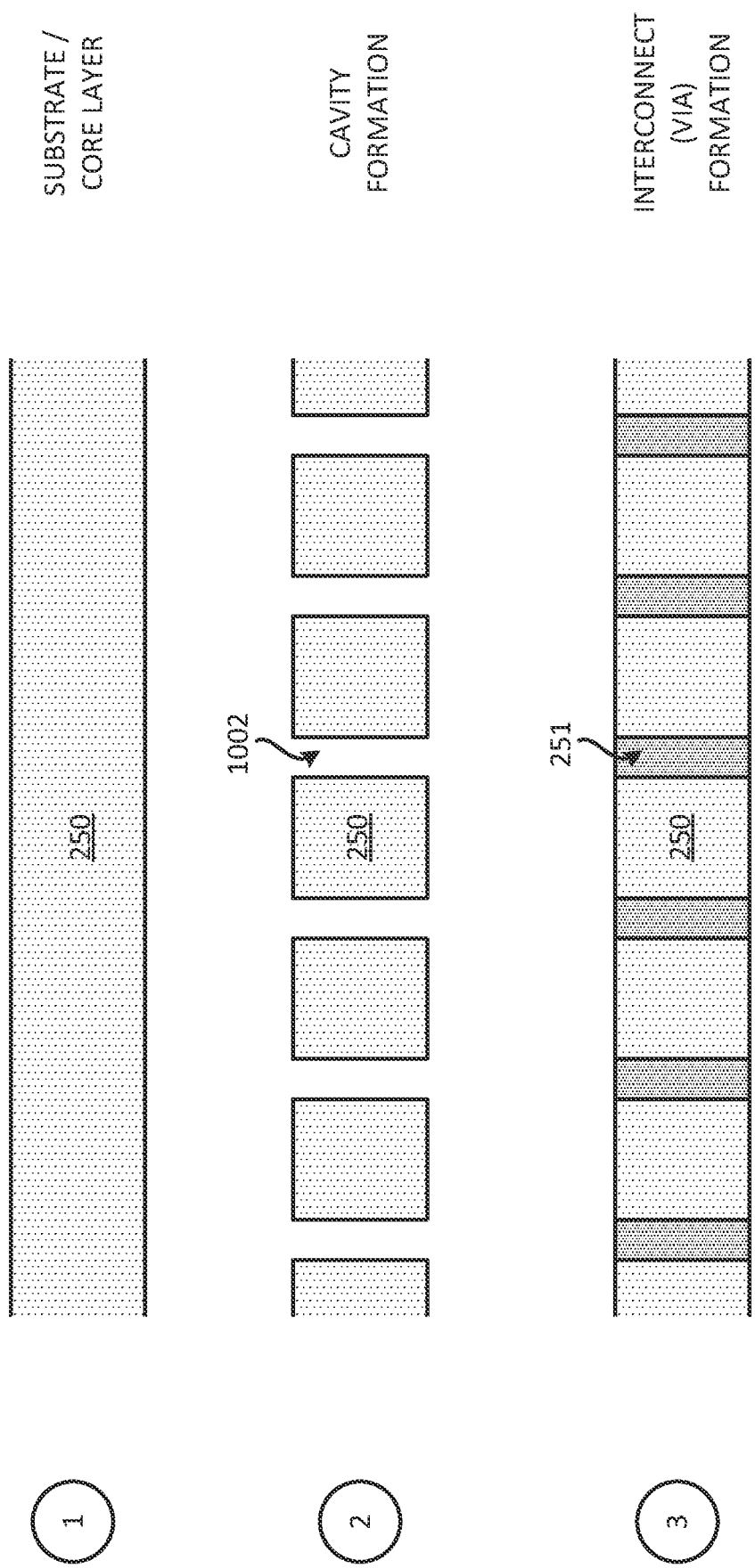

In some implementations, fabricating a capacitor device includes several processes. FIGS. 10A-10B illustrate an exemplary sequence for providing or fabricating an inductor device. In some implementations, the sequence of FIGS. 10A-10B may be used to provide or fabricate the inductor device 205. However, the process of FIGS. 10A-10B may be used to fabricate any of the inductor devices described in the disclosure.

It should be noted that the sequence of FIGS. 10A-10B may combine one or more stages in order to simplify and/or clarify the sequence for providing or fabricating an inductor device. In some implementations, the order of the processes may be changed or modified. In some implementations, one or more of processes may be replaced or substituted without departing from the spirit of the disclosure.

Stage 1, as shown in FIG. 10A, illustrates a state after a core layer 250 is provided. The core layer 250 may include a substrate, such as silicon (Si). The core layer 250 may be provided as a wafer.

Stage 2 illustrates after a plurality of cavities 1002 is formed in the core layer 250. A laser process (e.g., laser ablation) or an etching process may be used to form the cavities 1002.

Stage 3 illustrates a state after a plurality of interconnects 251 is formed in the cavities 1002. A plating process or a pasting process may be used to form the interconnects 251 in the cavities 1002. The interconnects 251 travel through the core layer 250. The interconnects 251 may include vias (e.g., via interconnects).

Stage 4, as shown in FIG. 10B, illustrates a state after (i) a plurality of interconnects 255 is formed over a first surface of the core layer 250 and (ii) a plurality of interconnects 257 is formed over a second surface of the core layer 250. A patterning process and a plating process may be used to form the plurality of interconnects 255 and 257. The plurality of interconnects 255 and 257 may be coupled to the plurality of interconnects 251. The plurality of interconnects 251, the plurality of interconnects 255 and the plurality of interconnects 257 may define an inductor (e.g., may define windings of an inductor).

Stage 5 illustrates a state after (i) a dielectric layer 254 is formed over the first surface of the core layer 250, and (ii) a dielectric layer 256 is formed over the second surface of the core layer 250. A deposition process may be used to form the dielectric layers 254 and 256. The dielectric layers 254 and 256 may include polyimide. However, different implementations may use different materials for the dielectric layers 254 and 256.

Stage 6 illustrates a state after singulation of a wafer to form a plurality of inductor devices 205 (e.g., 205a, 205b, 205c). Each inductor device 205 includes the core layer 250, the plurality of interconnects 251, the plurality of interconnects 255, the plurality of interconnects 257, the dielectric layer 254 and the dielectric layer 256. The plurality of interconnects 251, the plurality of interconnects 255, and the plurality of interconnects 257 may define an inductor (e.g., solenoid inductor).

Different implementations may use different processes for forming the interconnects and/or metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 11A:
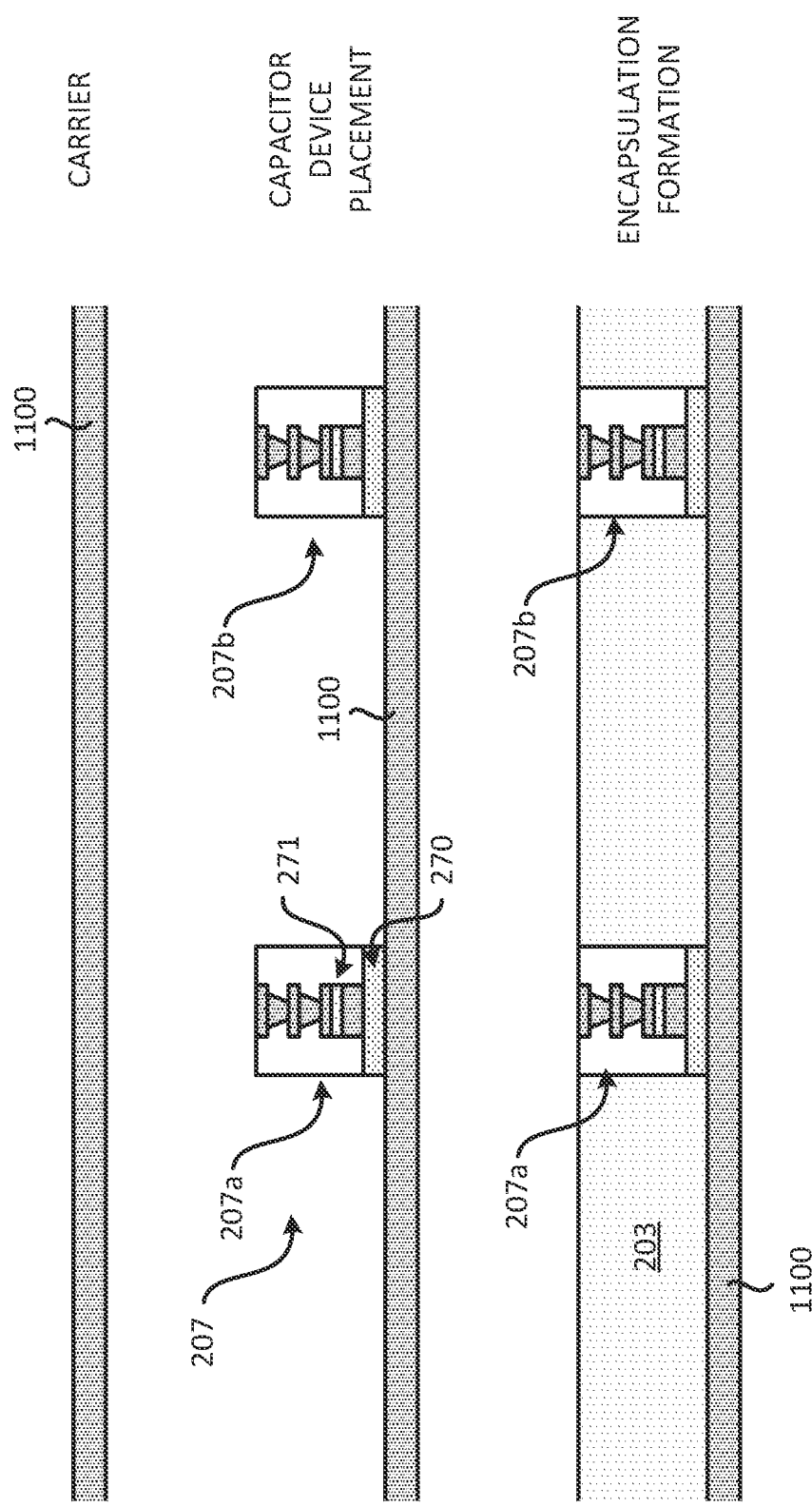
FIG. 11A-11C illustrate an exemplary sequence for fabricating a substrate that includes at least capacitor device and at least one inductor.
Figure 11B:
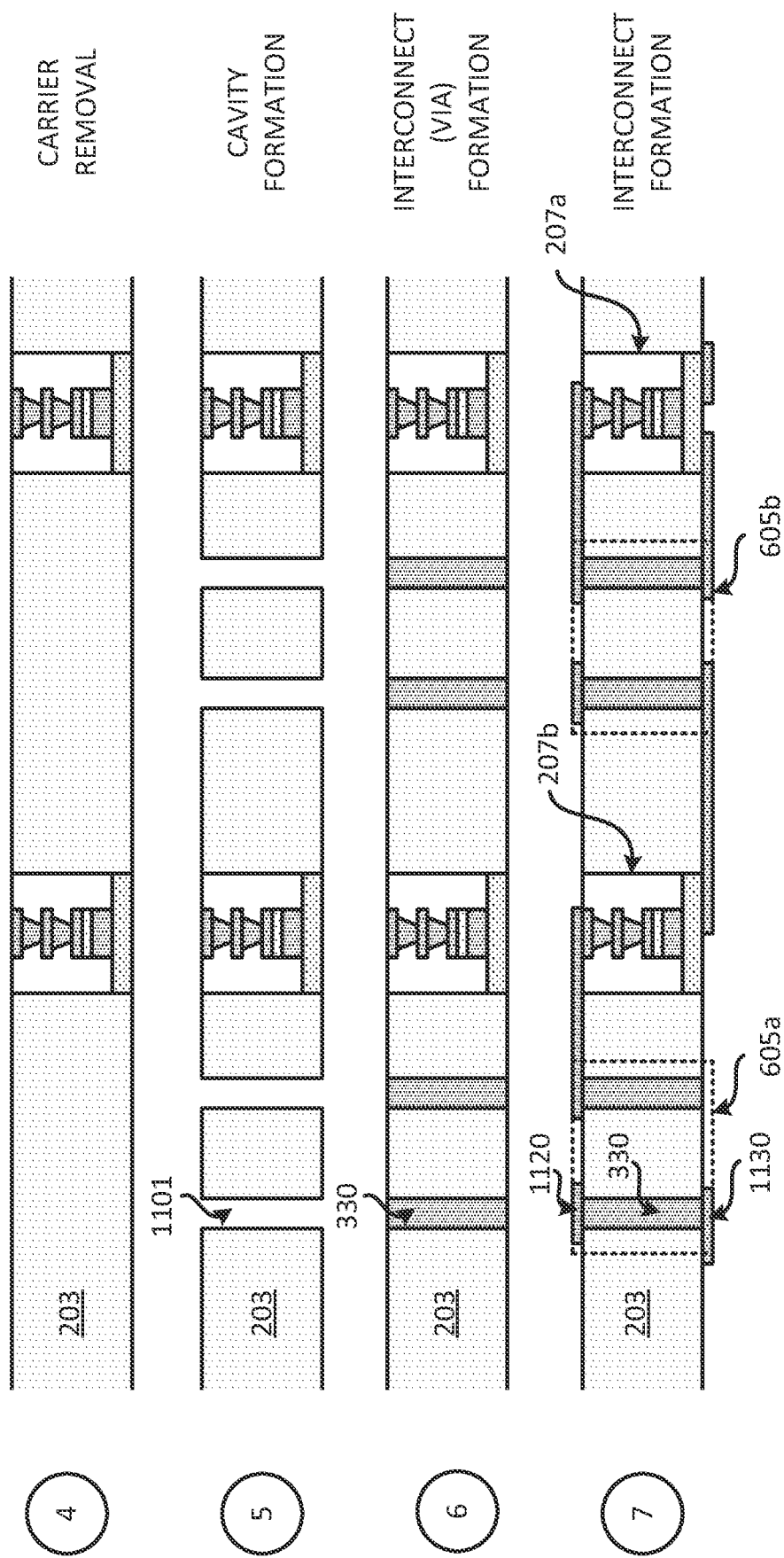
Figure 11C:
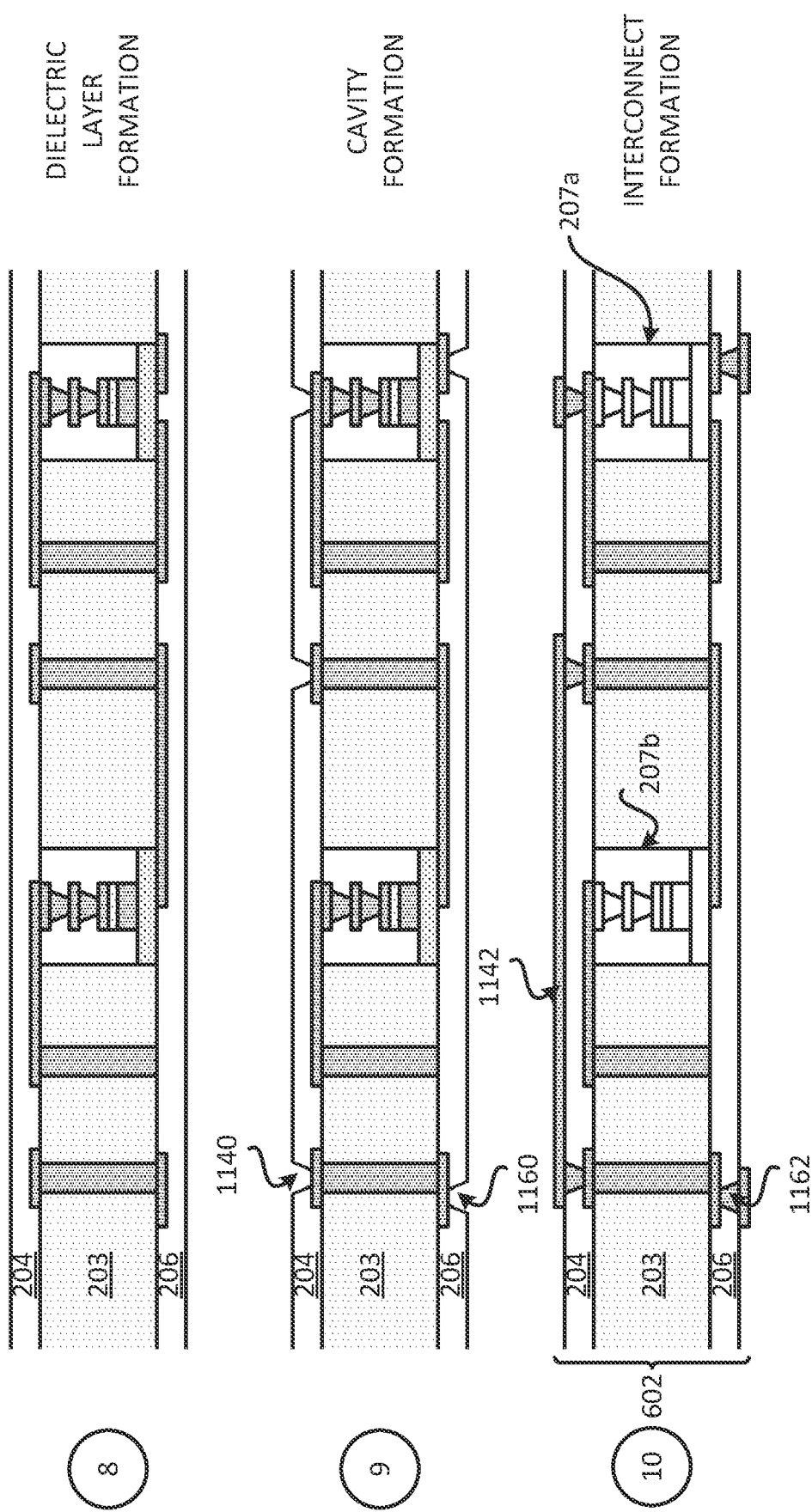

Exemplary Sequence for Fabricating a Substrate that Includes a Capacitor Device and an Inductor In some implementations, fabricating a substrate that includes a capacitor device and an inductor includes several processes. FIGS. 11A-11C illustrate an exemplary sequence for providing or fabricating a substrate that includes a capacitor device and an inductor. In some implementations, the sequence of FIGS. 11A-11C may be used to provide or fabricate the substrate 602 of FIG. 6. However, the process of FIGS. 11A-11C may be used to fabricate any of the substrates described in the disclosure.

It should be noted that the sequence of FIGS. 11A-11C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 11A, illustrates a state after a carrier 1100 is provided. The carrier 1100 may include a substrate.

Stage 2 illustrates a state after a plurality of capacitor devices 207 (e.g., 207a, 207b) is placed over the carrier 1100. The plurality of capacitor devices 207 may be placed using a pick and place process. The plurality of capacitor devices 207 is placed over the carrier 1100 such that the substrate 270 of the capacitor device 207 is touching the carrier 1100. In this example, the capacitor 271 may be located near the carrier 1100. In some implementations, one or more of the capacitor devices may be placed over the carrier 1100 such that the substrate 270 is located away from the carrier 1100. Thus, the capacitor devices 207 may be placed upright and/or upside down over the carrier 1100. FIGS. 9A-9D illustrate and describe an example of a process for fabricating a capacitor device.

Stage 3 illustrates a state after an encapsulation layer 203 is formed over the carrier 1100. A compression and transfer molding process, a sheet molding process, or a liquid molding process may be used to form the encapsulation. The encapsulation layer 203 may at least partially encapsulate the plurality of capacitor devices 207. In some implementations, the encapsulation layer 203 may be formed over the plurality of capacitor devices 207 and portions of the encapsulation layer 203 may be removed (e.g. grinded) such that a top surface of the encapsulation layer 203 is co-planar with the plurality of capacitor devices 207. The encapsulation layer 203 may include a mold, a resin and/or an epoxy. The encapsulation layer 203 may be means for encapsulation. layer 203. The encapsulation layer 203 may be photo etchable.

Stage 4, as shown in FIG. 11B, illustrates a state after the carrier 1100 is decoupled from the encapsulation layer 203 and the plurality of capacitor devices 207. Decoupling the carrier 1100, may include removing, detaching, grinding and/or dissolving the carrier 1100 using a mechanical process and/or a chemical process.

Stage 5 illustrates a state after a plurality of cavities 1101 is formed in the encapsulation layer 203. A laser process (e.g., laser ablation), a lithography process (e.g., exposure and development), or an etching process may be used to form the cavities 1101.

Stage 6 illustrates a state after a plurality of interconnects 330 is formed in the cavities 1101. A plating process or a pasting process may be used to form the interconnects 330 in the cavities 1101. The interconnects 330 travel through the encapsulation layer 203. The interconnects 330 may include vias (e.g., via interconnects).

Stage 7 illustrates a state after (i) a plurality of interconnects 1120 is formed over a first surface of the encapsulation layer 203 and (ii) a plurality of interconnects 1130 is formed over a second surface of the encapsulation layer 203. A patterning process and a plating process may be used to form the plurality of interconnects 1120 and 1130. The plurality of interconnects 1120 and 1130 may be coupled to the plurality of interconnects 330. At least some of the interconnects from the plurality of interconnects 330, the plurality of interconnects 1120 and the plurality of interconnects 1130 may define an inductor (e.g., may define windings of an inductor), such as the inductor 605a and the inductor 605b. Some of the interconnects from the plurality of interconnects 1120 and 1130 may be coupled to the capacitor devices 207a and 207b. For example, some of the interconnects from the plurality of interconnects 1120 and 1130 may be coupled to interconnects of the capacitor devices 207a and 207b.

Stage 8, as shown in FIG. 11C, illustrates a state after (i) a dielectric layer 204 is formed over the first surface of the encapsulation layer 203, the capacitor devices (e.g., 207a, 207b) and the plurality of interconnects 1120, and (ii) a dielectric layer 206 is formed over the second surface of the encapsulation layer 203, the capacitor devices (e.g., 207a, 207b) and the plurality of interconnects 1130. A deposition process may be used to form the dielectric layers 204 and 204. The dielectric layers 204 and 206 may include polyimide. However, different implementations may use different materials for the dielectric layers 204 and 206.

Stage 9 illustrates after a plurality of cavities 1140 is formed in the dielectric layer 204 and a plurality of cavities 1160 is formed in the dielectric layer 206. A laser process (e.g., laser ablation), a lithography process (e.g., exposure and development), or an etching process may be used to form the cavities 1140 and 1160.

Stage 10 illustrates a state after (i) a plurality of interconnects 1142 is formed in and/or over the dielectric layer 204, and (ii) a plurality of interconnects 1162 is formed in and/or over the dielectric layer 206. A patterning process and a plating process may be used to form the interconnects 1142 and 1162. Some of the interconnects 1142 may be formed in the cavities 1140. Some of the interconnects 1162 may be formed in the cavities 1160. The interconnects 1142 and 1162 may include vias, pads and/or traces. The interconnects 1120 and 1142 may be represented by the plurality of interconnects 240. The interconnects 1130 and 1162 may be represented by the plurality of interconnects 260. Stage 10 may illustrate the substrate 602 of FIG. 6. The plurality of interconnects (e.g., 1120, 1142) and/or the plurality of interconnects (1130, 1162) may include redistribution interconnects. The plurality of interconnects (e.g., 1120, 1142) and/or the plurality of interconnects (1130, 1162) may be fabricated using a redistribution layer (RDL) fabrication process.

Exemplary Sequence for Fabricating a Substrate that Includes a Capacitor Device and an Inductor Device In some implementations, fabricating a substrate that includes a capacitor device and an inductor device includes several processes. FIGS. 12A-12D illustrate an exemplary sequence for providing or fabricating a substrate that includes a capacitor device and an inductor device. In some implementations, the sequence of FIGS. 12A-12D may be used to provide or fabricate the substrate 202 of FIG. 3. However, the process of FIGS. 12A-12D may be used to fabricate any of the substrates described in the disclosure.

It should be noted that the sequence of FIGS. 12A-12D may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 12A:
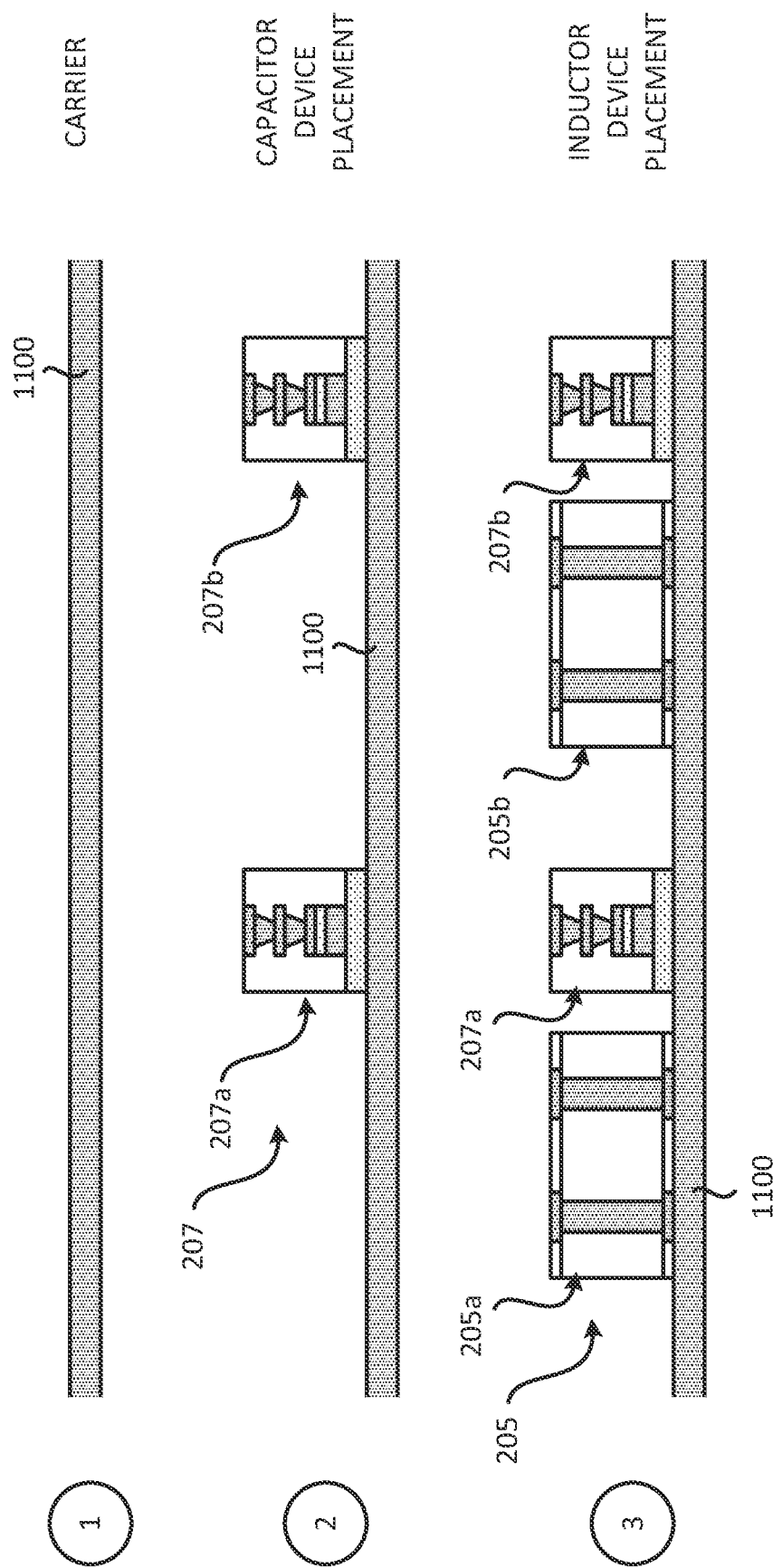
FIG. 12A-12D illustrate an exemplary sequence for fabricating a substrate that includes at least capacitor device and at least one inductor device.

Stage 1, as shown in FIG. 12A, illustrates a state after a carrier 1100 is provided. The carrier 1100 may include a substrate.

Stage 2 illustrates a state after a plurality of capacitor devices 207 (e.g., 207a, 207b) is placed over the carrier 1100. The plurality of capacitor devices 207 may be placed using a pick and place process. The plurality of capacitor devices 207 is placed over the carrier 1100 such that the substrate 270 of the capacitor device 207 is touching the carrier 1100. In this example, the capacitor 271 may be located near the carrier 1100. In some implementations, one or more of the capacitor devices may be placed over the carrier 1100 such that the substrate 270 is located away from the carrier 1100. Thus, the capacitor devices 207 may be placed upright and/or upside down over the carrier 1100. FIGS. 9A-9D illustrate and describe an example of a process for fabricating a capacitor device.

Stage 3 illustrates a state after a plurality of inductor devices 205 (e.g., 205a, 205b) is placed over the carrier 1100. The plurality of inductor devices 205 may be placed using a pick and place process. FIGS. 10A-10B illustrate and describe an example of a process for fabricating an inductor device.

Figure 12B:
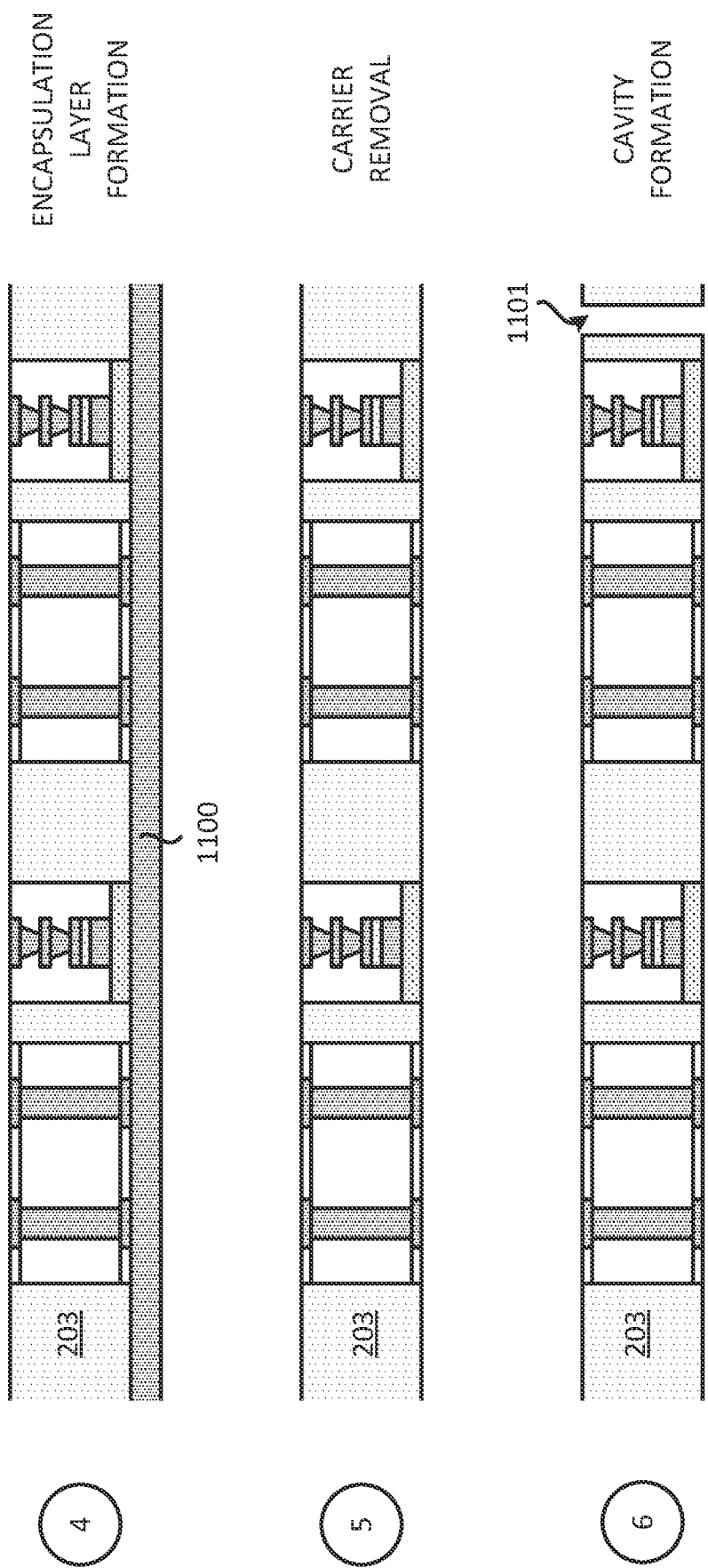

Stage 4, as shown in FIG. 12B, illustrates a state after an encapsulation layer 203 is formed over the carrier 1100. A compression and transfer molding process, a sheet molding process, or a liquid molding process may be used to form the encapsulation layer 203. The encapsulation layer 203 may at least partially encapsulate the plurality of capacitor devices 207 and the plurality of inductor devices 205. In some implementations, the encapsulation layer 203 may be formed over the plurality of capacitor devices 207 and the plurality of inductor devices 205, and portions of the encapsulation layer 203 may be removed (e.g. grinded) such that a top surface of the encapsulation layer 203 is co-planar with the plurality of capacitor devices 207 and the plurality of inductor devices 205. The encapsulation layer 203 may include a mold, a resin and/or an epoxy. The encapsulation layer 203 may be means for encapsulation. The encapsulation layer 203 may be photo etchable.

Stage 5 illustrates a state after the carrier 1100 is decoupled from the encapsulation layer 203 and the plurality of capacitor devices 207 and the plurality of inductor devices 205. Decoupling the carrier 1100, may include removing, detaching, grinding and/or dissolving the carrier 1100 using a mechanical process and/or a chemical process.

Stage 6 illustrates a state after a plurality of cavities 1101 is formed in the encapsulation layer 203. A laser process (e.g., laser ablation), a lithography process (e.g., exposure and development), or an etching process may be used to form the cavities 1101

Figure 12C:
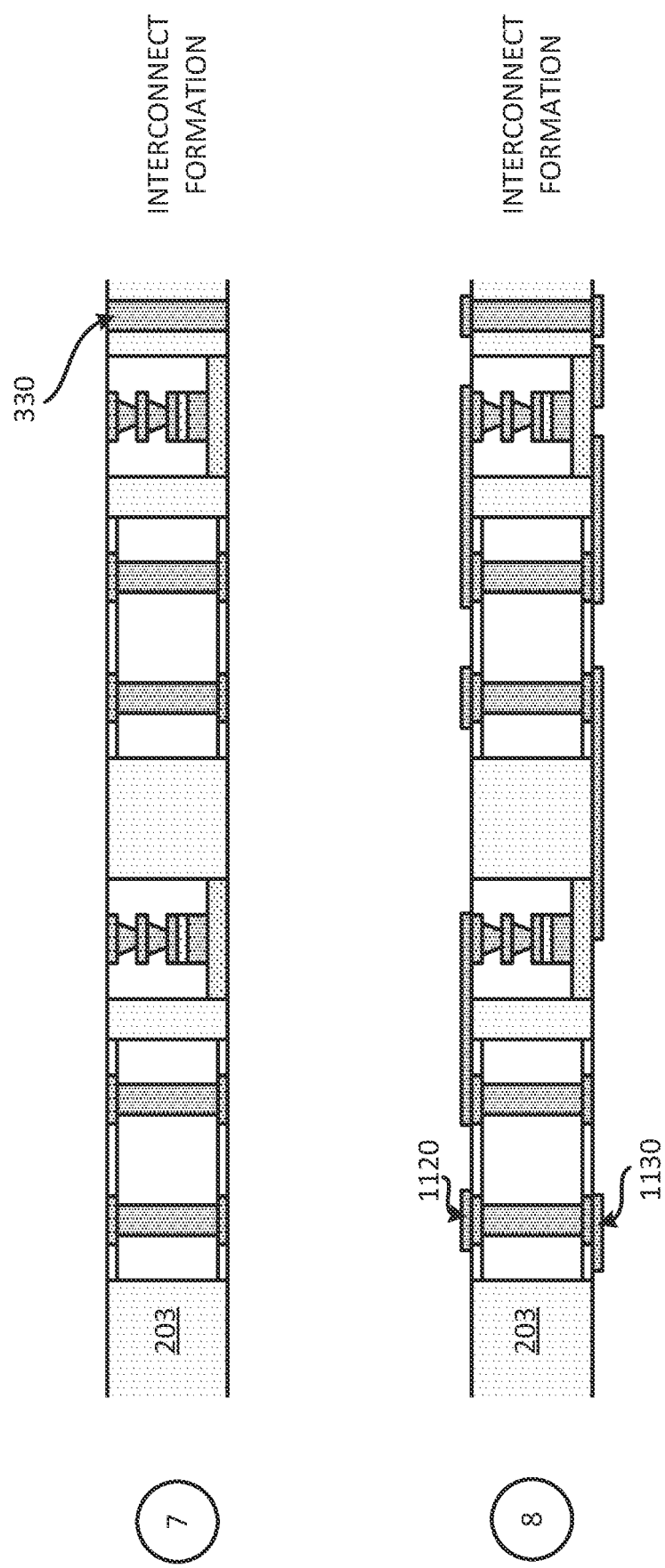

Stage 7, as shown in FIG. 12C, illustrates a state after a plurality of interconnects 330 is formed in the cavities 1101. A plating process or a pasting process may be used to form the interconnects 330 in the cavities 1101. The interconnects 330 travel through the encapsulation layer 203. The interconnects 330 may include vias (e.g., via interconnects).

Stage 8 illustrates a state after (i) a plurality of interconnects 1120 is formed over a first surface of the encapsulation layer 203 and (ii) a plurality of interconnects 1130 is formed over a second surface of the encapsulation layer 203. A patterning process and a plating process may be used to form the plurality of interconnects 1120 and 1130. The plurality of interconnects 1120 and 1130 may be coupled to the plurality of interconnects 330. Some of the interconnects from the plurality of interconnects 1120 and 1130 may be coupled to the capacitor devices 207a and 207b, and the inductor devices 205a and 205b. For example, some of the interconnects from the plurality of interconnects 1120 and 1130 may be coupled to interconnects of the capacitor devices 207a and 207b and the interconnects of the inductor devices 205a and 205b. In some implementations, at least some of the interconnects from the plurality of interconnects 330, the plurality of interconnects 1120 and the plurality of interconnects 1130 may define an inductor (e.g., inductor 605a, inductor 605b).

Figure 12D:
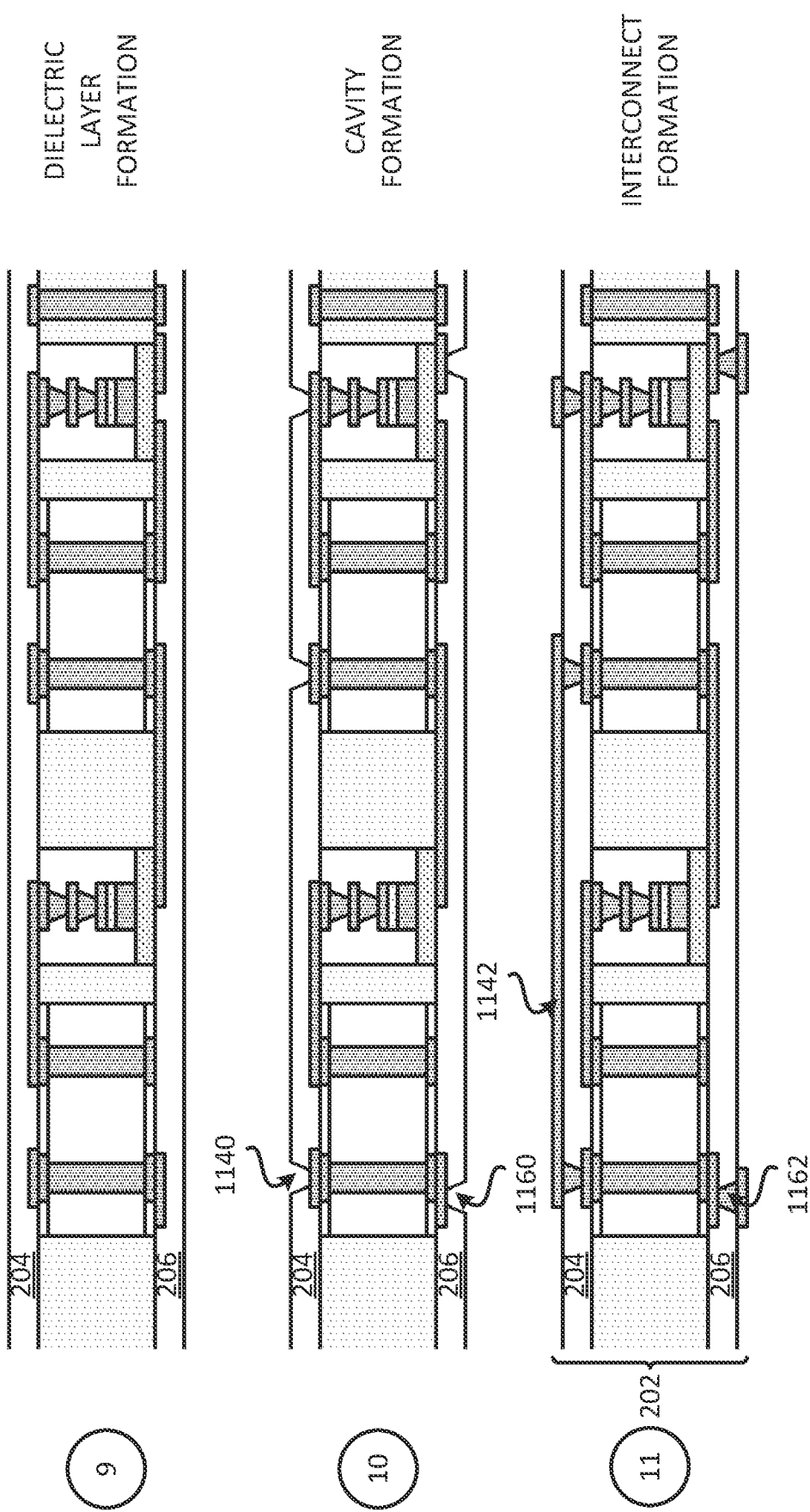

Stage 9, as shown in FIG. 12D, illustrates a state after (i) a dielectric layer 204 is formed over the first surface of the encapsulation layer 203, the capacitor devices (e.g., 207a, 207b), the inductor devices (e.g., 205a, 205b) and the plurality of interconnects 1120, and (ii) a dielectric layer 206 is formed over the second surface of the encapsulation layer 203, the capacitor devices (e.g., 207a, 207b), the inductor devices (e.g., 205a, 205b) and the plurality of interconnects 1130. A deposition process may be used to form the dielectric layers 204 and 204. The dielectric layers 204 and 206 may include polyimide. However, different implementations may use different materials for the dielectric layers 204 and 206.

Stage 10 illustrates after a plurality of cavities 1140 is formed in the dielectric layer 204 and a plurality of cavities 1160 is formed in the dielectric layer 206. A laser process (e.g., laser ablation), a lithography process (e.g., exposure and development), or an etching process may be used to form the cavities 1140 and 1160.

Stage 11 illustrates a state after (i) a plurality of interconnects 1142 is formed in and/or over the dielectric layer 204, and (ii) a plurality of interconnects 1162 is formed in and/or over the dielectric layer 206. A patterning process and a plating process may be used to form the interconnects 1142 and 1162. Some of the interconnects 1142 may be formed in the cavities 1140. Some of the interconnects 1162 may be formed in the cavities 1160. The interconnects 1142 and 1162 may include vias, pads and/or traces. The interconnects 1120 and 1142 may be represented by the plurality of interconnects 240. The interconnects 1130 and 1162 may be represented by the plurality of interconnects 260. Stage 11 may illustrate the substrate 202 of FIG. 3. The plurality of interconnects (e.g., 1120, 1142) and/or the plurality of interconnects (1130, 1162) may include redistribution interconnects. The plurality of interconnects (e.g., 1120, 1142) and/or the plurality of interconnects (1130, 1162) may be fabricated using a redistribution layer (RDL) fabrication process.

Figure 13:
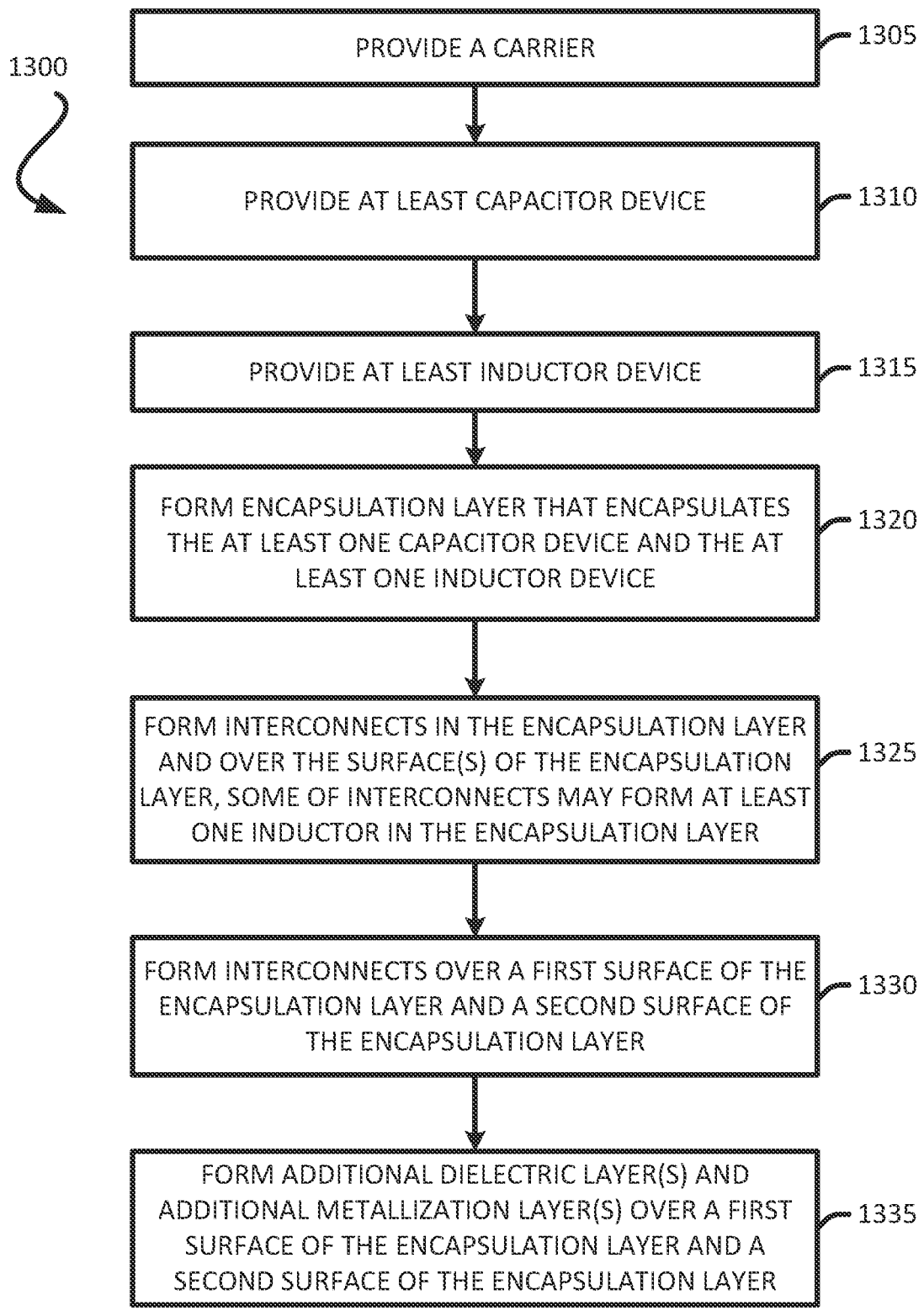
FIG. 13 illustrates an exemplary flow diagram of a method for fabricating a substrate that includes at least capacitor device and at least one inductor device.

Exemplary Flow Diagram of a Method for Fabricating a Substrate that Includes a Capacitor Device and an Inductor In some implementations, fabricating a substrate that includes a capacitor device and an inductor includes several processes. FIG. 13 illustrates an exemplary flow diagram of a method 1300 for providing or fabricating a substrate that includes a capacitor device and an inductor. In some implementations, the method 1300 of FIG. 13 may be used to provide or fabricate the substrate 602 of FIG. 6. However, the method 1600 may be used to fabricated any substrate that includes a capacitor device and an inductor (e.g., inductor device).

It should be noted that the sequence of FIG. 13 may combine one or more processes in order to simplify and/or clarify the method for providing or fabricating a substrate. In some implementations, the order of the processes may be changed or modified.

The method provides (at 1305) a carrier (e.g., 1100). The carrier 1100 may include a substrate. Stage 1 of FIG. 12A, illustrates an example of providing carrier.

The method provides (at 1310) at least one capacitor device (e.g., 207) over the carrier. The capacitor device may be placed using a pick and place process. The capacitor device may be placed upright or upside down over the carrier. For example, the capacitor device 207 may be placed over the carrier 1100 such that the substrate 270 of the capacitor device 207 is touching the carrier 1100. In another example, the capacitor device 207 may be placed over the carrier 1100 such that the substrate 270 is located away from the carrier 1100. Stage 2 of FIG. 12A, illustrates and describes an example of providing and placing at least one capacitor device over a carrier.

The method provides (at 1315) at least one an inductor device (e.g., 205) over the carrier. The inductor device may be placed using a pick and place process. Stage 3 of FIG. 12A, illustrates and describes an example of providing and placing at least one inductor device over a carrier.

The method forms (at 1320) an encapsulation layer (e.g., 203) over the carrier, and encapsulates the capacitor device(s) and the inductor device(s). A compression and transfer molding process, a sheet molding process, or a liquid molding process may be used to form the encapsulation layer 203. The encapsulation layer 203 may at least partially encapsulate the at least one capacitor devices 207 and the at least one inductor devices 205. In some implementations, the encapsulation layer 203 may be formed over the at least one capacitor devices 207 and the at least one inductor devices 205, and portions of the encapsulation layer 203 may be removed (e.g. grinded) such that a top surface of the encapsulation layer 203 is co-planar with the at least one capacitor devices 207 and the at least one inductor devices 205. The encapsulation layer 203 may include a mold, a resin and/or an epoxy. The encapsulation layer 203 may be means for encapsulation. The encapsulation layer 203 may be photo etchable. Stage 4 of FIG. 12B illustrates and describes an example of forming an encapsulation layer.

Once the encapsulation layer 203 is formed, the method 1300 may decouple the carrier (e.g., 1100) from the encapsulation layer 203, the at least one capacitor device 207 and the at least one inductor device. Decoupling the carrier 1100, may include removing, detaching, grinding and/or dissolving the carrier 1100 using a mechanical process and/or a chemical process. Stage 5 of FIG. 12B illustrates and describes an example of carrier decoupling.

The method forms (at 1325) interconnects (e.g., 330) in the encapsulation layer (e.g., 203). The interconnects may be formed after the encapsulation layer is formed and/or after the decoupling of the carrier 1100. Forming the interconnects (e.g., 330) in the encapsulation layer may include forming cavities in the encapsulation layer and filing the cavities with an electrically conductive material. A plating process and/or a pasting process may be used to form the interconnects in the encapsulation layer. In some implementations, some of the interconnects in the encapsulation layer may be configured to operate as an inductor (e.g., 605a). Stages 6-7 of FIGS. 12B-12C illustrate and describe an example of forming interconnects in an encapsulation layer.

The method forms (at 1330) interconnects (e.g., 1120, 1130) over a surface the encapsulation layer (e.g., 203) and over surfaces of the encapsulation layer. Interconnects may be formed over a first surface of the encapsulation layer and over a second surface of the encapsulation layer. A plating process may be used to form the interconnects over the encapsulation layer. In some implementations, some of the interconnects in and over the encapsulation layer may be configured to operate as an inductor (e.g., 605a). The interconnects (e.g., 1120, 1130) may be coupled to the interconnects in the encapsulation layer and to the at least one capacitor device 207 and the at least one inductor device 205. Stage 8 of FIG. 12C illustrates and describes an example of forming interconnects over a surface of an encapsulation layer.

The method may form (at 1335) dielectric layers (e.g., 204, 206) over (i) the first surface of the encapsulation layer and (ii) the second surface of the encapsulation layer. The method may also form (at 1335) additional interconnects (e.g., 1142, 1162) in and over the dielectric layers (e.g., 204, 206). Forming the additional interconnects may include forming cavities in the dielectric layers. Stages 9-11 of FIG. 12D illustrate and describe an example of forming dielectric layers and additional interconnects.

Once the substrate (e.g., 202, 402, 502, 602) is fabricated or provided, a power amplifier and at least one integrated device may be coupled to the substrate. For example, one or more solder reflow processes may be used to couple the power amplifier and the at least one integrated device through solder interconnects.

Exemplary Output Matching Networks

Figure 14:
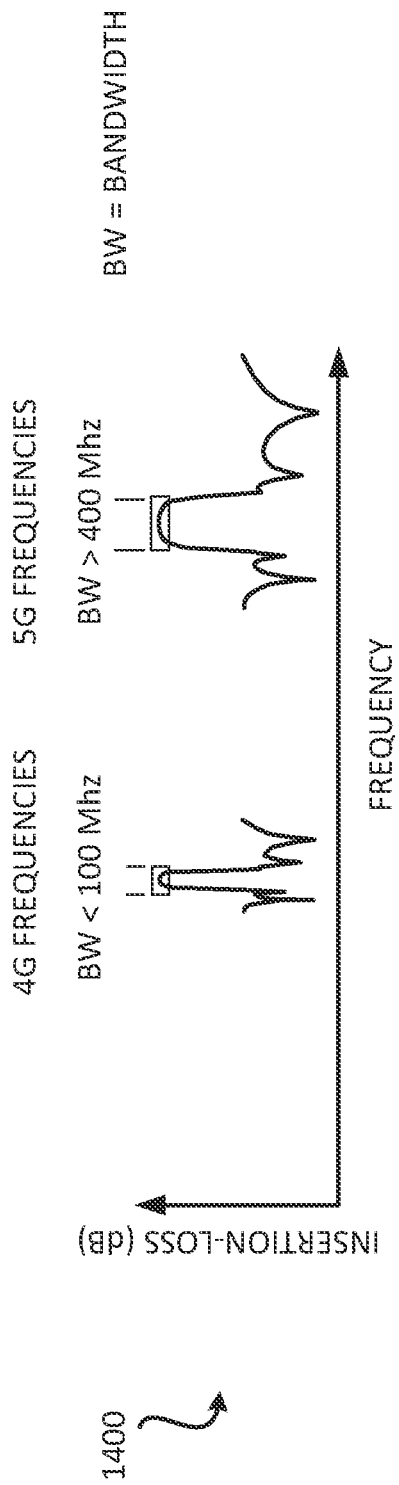
FIG. 14 illustrates a graph that shows possible filtering for various frequencies.

FIG. 14 illustrates a graph of exemplary frequencies that may be filtered for two types of radio frequency communications. As shown in FIG. 14, a first cellular communication protocol may operate in a narrower frequency bandwidth than a broader frequency bandwidth of a second cellular communication protocol. In the example of FIG. 14, the first cellular communication protocol may be a 4G communication protocol and the second cellular protocol may be a 5G communication protocol. The first cellular communication protocol may operate in a frequency bandwidth (BW) of about 194 Megahertz (Mhz) (e.g., 2496 MHz-2690 MHz). The second cellular communication protocol may operate in a frequency bandwidth of about 600 Mhz (e.g., 4400 MHz-5000 MHz). As shown in FIG. 14, this means that a wireless device that is configured to operate using the second cellular communication protocol has 3 times more frequencies to account for than for frequencies for the first cellular communication protocol. As shown in FIG. 14, filters (e.g., narrowband filters, broadband filters) need to be designed to appropriately deal with the increased frequency bandwidth for 5G frequencies.

As mentioned above, power amplifiers are coupled to antennas. In order to transfer as much power as possible between the power amplifier and the antenna, the impedance of the power amplifier has to match as closely as possible to the impedance of the antenna. A matching network (e.g., output matching network) may be used to ensure that an impedance of a power amplifier closely matches the impedance of an antenna, and vice versa.

Figure 15:
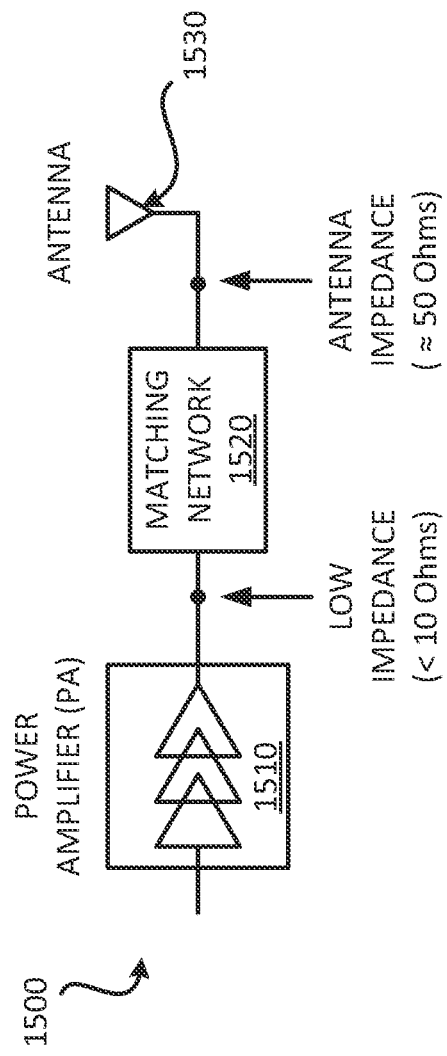
FIG. 15 illustrates a conceptual matching network coupled to a power amplifier and an antenna.

FIG. 15 illustrates a conceptual diagram 1500 that includes a power amplifier 1510, a matching network 1520 and an antenna 1530. The power amplifier 1510 is configured to be electrically coupled to the antenna 1530 through the matching network 1520. The matching network 1520 may be an output matching network. As shown in FIG. 15, a power amplifier 1510 that is configured to operate 5G communication protocols may have an impedance of less than 10 Ohms, while an antenna may have an impedance of 50 Ohms. To bridge this impedance difference, the matching network 1520 is used. The matching network 1520 may include at least one capacitor and at least one inductor.

Figure 16:
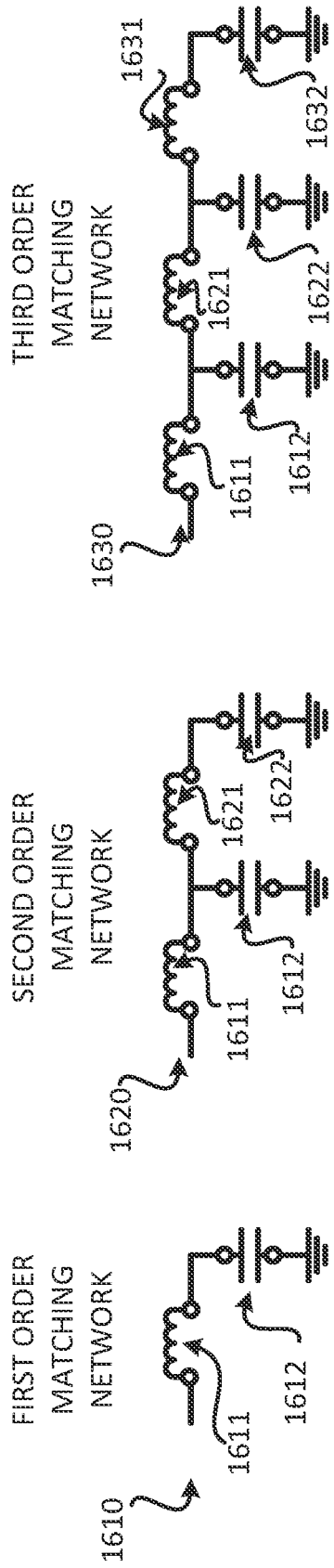
FIG. 16 illustrates various circuit diagrams of matching networks.

FIG. 16 illustrates circuit diagrams of three matching networks, a first matching network 1610, a second matching network 1620 and a third matching network 1630. The matching networks shown in FIG. 16 may be implemented in the matching network 1520 and/or any of the substrates described in the disclosure. A matching network may be defined by one or more combinations of capacitors and inductors.

The first matching network 1610 includes a first inductor 1611 and a first capacitor 1612. The first inductor 1611 may be configured to be electrically coupled to the first capacitor 1612. The first capacitor 1612 may be configured to be coupled to ground. The first inductor 1611 may be any of inductor(s) (e.g., 605a) and/or inductor devices (e.g., 205a) described in the disclosure. The first capacitor 1612 may be any of the capacitor devices (e.g., 207a) and/or capacitors (e.g., 271) described in the disclosure. The first matching network 1610 may be a first order matching network.

The second matching network 1620 includes the first inductor 1611, the first capacitor 1612, a second inductor 1621, and a second capacitor 1622. The second inductor 1621 may be configured to be electrically coupled to the second capacitor 1622. The second capacitor 1622 may be configured to be coupled to ground. The second inductor 1621 may be configured to be electrically coupled to the first inductor 1611 and the first capacitor 1612. The second inductor 1621 may be any of inductor(s) (e.g., 605a) and/or inductor devices (e.g., 205a) described in the disclosure. The second capacitor 1622 may be any of the capacitor devices (e.g., 207a) and/or capacitors (e.g., 271) described in the disclosure. The second matching network 1620 may be a second order matching network.

The third matching network 1630 includes the first inductor 1611, the first capacitor 1612, the second inductor 1621, the second capacitor 1622, a third inductor 1631, and a third capacitor 1632. The third inductor 1631 may be configured to be electrically coupled to the third capacitor 1632. The third capacitor 1632 may be configured to be coupled to ground. The third inductor 1631 may be configured to be electrically coupled to the second inductor 1621 and the second capacitor 1622. The third inductor 1631 may be any of inductor(s) (e.g., 605a) and/or inductor devices (e.g., 205a) described in the disclosure. The third capacitor 1632 may be any of the capacitor devices (e.g., 207a) and/or capacitors (e.g., 271) described in the disclosure. The third matching network 1630 may be a third order matching network.

Figure 17:
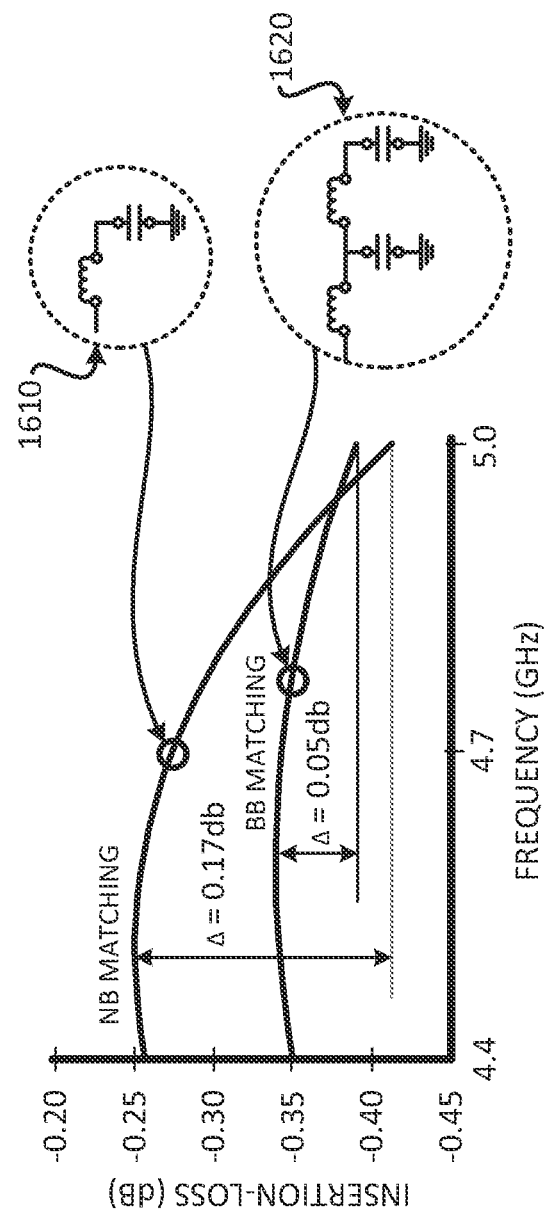
FIG. 17 illustrates a graph that shows various exemplary matching network performances for various frequencies.

FIG. 17 illustrates a graph that show how using different matching networks may help improve impedance match for narrowband bandwidth and broadband bandwidth. FIG. 17 illustrates how using more combinations of the capacitor and an inductor helps improve impedance matching across a wider range of frequencies. As shown in FIG. 17, the insertion-loss difference within the bandwidth (BW≈600 MHz) is defined as $\Delta$ and the value ($\Delta$) is computed as the difference between the maximum value–the minimum value within the bandwidth. For a narrow band (NB) matching network, the insertion-loss difference ($\Delta$) is calculated as (0.42 dB for max. insertion-loss) minus (0.25 dB for min. insertion-loss), while for the broadband (BB) matching network, the insertion-loss difference ($\Delta$) is calculated by (0.39 dB–0.34 dB). From the computed $\Delta$s (0.17 dB for NB and 0.05 dB for BB), we can realize that $\Delta$ (BB) is less than $\Delta$ (NB). The matching networks (such as the one described in at least FIG. 16) described in the disclosure may be used, and the lower value ($\Delta$) is better for the device performance. The figure shows the BB matching network is better than NB matching network for the broadband application. The BB matching network requires more passive components (e.g., inductors and capacitors) than the NB matching network. Therefore, we may need more components to improve matching flatness ($\Delta$) with the bandwidth. FIG. 17 illustrates an example of why having more inductors and capacitors may be beneficial for a filter. As described above, the disclosure describes various structures and configurations that allow several inductors and capacitors to be implemented in a small and compact form factor.

Exemplary Electronic Devices

Figure 18:
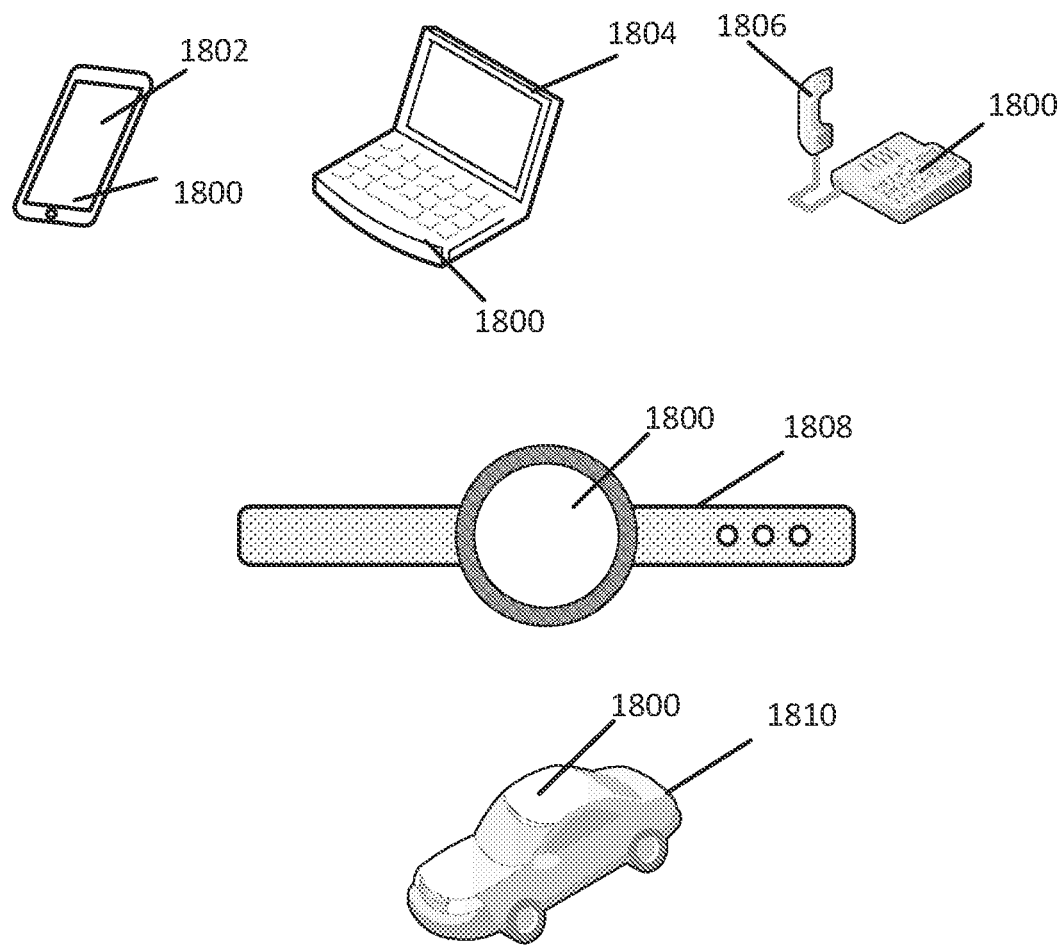
FIG. 18 illustrates various electronic devices that may integrate a die, an integrated device, an integrated passive device (IPD), a device package, a package, an integrated circuit and/or PCB described herein.

FIG. 18 illustrates various electronic devices that may be integrated with any of the aforementioned transistor, device, integrated device, integrated circuit (IC) package, integrated circuit (IC) device, semiconductor device, integrated circuit, die, interposer, package or package-on-package (PoP). For example, a mobile phone device 1802, a laptop computer device 1804, a fixed location terminal device 1806, or a wearable device 1808 may include a device 1800 as described herein. The device 1800 may be, for example, any of the devices and/or integrated circuit (IC) packages described herein. The devices 1802, 1804, 1806 and 1808 illustrated in FIG. 18 are merely exemplary. Other electronic devices may also feature the device 1800 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-8, 9A-9D, 10A-10B, 11A-11C, 12A-12D, and 13-18 may be rearranged and/or combined into a single component, process, feature or function or embodied in several components, processes, or functions. Additional elements, components, processes, and/or functions may also be added without departing from the disclosure. It should also be noted FIGS. 2-8, 9A-9D, 10A-10B, 11A-11C, 12A-12D, and 13-18 and its corresponding description in the present disclosure is not limited to dies and/or ICs. In some implementations, FIGS. 2-8, 9A-9D, 10A-10B, 11A-11C, 12A-12D, and 13-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. The term "encapsulating" means that the object may partially encapsulate or completely encapsulate another object. The term "surrounding" means that an object may partially surround or completely surround another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
an encapsulation layer;
a capacitor device located in the encapsulation layer, wherein the capacitor device comprises:
a capacitor substrate;
a first capacitor metal layer;
an insulator layer coupled to the first capacitor metal layer;
a second capacitor metal layer coupled to the insulator layer such that the insulator layer is located between the first capacitor metal layer and the second capacitor metal layer; and
at least one capacitor device dielectric layer;
an inductor located in the encapsulation layer;
at least one first dielectric layer coupled to a first surface of the encapsulation layer; and
a plurality of first interconnects coupled to the first surface of the encapsulation layer,
wherein the plurality of first interconnects is located at least in the at least one first dielectric layer, and
wherein the plurality of first interconnects is coupled to the capacitor device and the inductor.

2. The substrate of claim 1, further comprising:
at least one second dielectric layer coupled to a second surface of the encapsulation layer; and
a plurality of second interconnects coupled to the second surface of the encapsulation layer, wherein the plurality of second interconnects is located at least in the at least one second dielectric layer.

3. The substrate of claim 2, further comprising a plurality of via interconnects located in the encapsulation layer.

4. The substrate of claim 3, wherein the inductor is defined by interconnects from the plurality of via interconnects, the plurality of first interconnects and the plurality of second interconnects.

5. The substrate of claim 1, wherein the inductor includes an inductor device comprising:
an inductor core layer;
a plurality of via interconnects traveling through the inductor core layer;
a plurality of interconnects coupled to the plurality of via interconnects; and
at least one dielectric layer coupled to the inductor core layer.

6. The substrate of claim 1, wherein the at least one capacitor device dielectric layer of the capacitor device is different from the encapsulation layer of the substrate.

7. The substrate of claim 1,
wherein the inductor and the capacitor device are configured to be electrically coupled together to operate as elements of a matching network for a power amplifier, and
wherein the capacitor device is configured to be coupled to ground.

8. The substrate of claim 7, wherein the inductor is an inductor device.

9. The substrate of claim 1, further comprising:
a second capacitor device located in the encapsulation layer; and
a second inductor located in the encapsulation layer,
wherein the inductor, the capacitor device, the second inductor, and the second capacitor device are configured to be electrically coupled together to operate as elements of a matching network for a power amplifier, and
wherein the capacitor device and the second capacitor device are configured to be coupled to ground.

10. The substrate of claim 9, wherein the inductor and/or the second inductor are each an inductor device.

11. The substrate of claim 9, further comprising:
a third capacitor device located in the encapsulation layer; and
a third inductor located in the encapsulation layer,
wherein the inductor, the capacitor device, the second inductor, the second capacitor device, the third inductor and the third capacitor device are configured to be electrically coupled together to operate as elements of a matching network for a power amplifier, and
wherein the capacitor device, the second capacitor device, and the third capacitor device are configured to be coupled to ground.

12. The substrate of claim 1, wherein the substrate is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

13. A package comprising:
a power amplifier; and
a substrate coupled to the power amplifier, wherein the substrate comprises:
an encapsulation layer;
a capacitor device located in the encapsulation layer, wherein the capacitor device comprises:
a capacitor substrate;
a first capacitor metal layer;
an insulator layer coupled to the first capacitor metal layer;
a second capacitor metal layer coupled to the insulator layer such that the insulator layer is located between the first capacitor metal layer and the second capacitor metal layer; and
at least one capacitor device dielectric layer;
an inductor located in the encapsulation layer;
at least one first dielectric layer coupled to a first surface of the encapsulation layer; and
a plurality of first interconnects coupled to the first surface of the encapsulation layer,
wherein the plurality of first interconnects is located at least in the at least one first dielectric layer,
wherein the plurality of first interconnects is coupled to the capacitor device and the inductor,
wherein the inductor and the capacitor device are configured to be electrically coupled together to operate as elements of a matching network for the power amplifier, and
wherein the capacitor device is configured to be coupled to ground.

14. The package of claim 13, wherein the substrate further comprises:
at least one second dielectric layer coupled to a second surface of the encapsulation layer; and
a plurality of second interconnects coupled to the second surface of the encapsulation layer, wherein the plurality of second interconnects is located at least in the at least one second dielectric layer.

15. The package of claim 14, wherein the substrate further includes a plurality of via interconnects located in the encapsulation layer.

16. The package of claim 15, wherein the inductor is defined by interconnects from the plurality of via interconnects, the plurality of first interconnects and the plurality of second interconnects.

17. The package of claim 13, wherein the inductor includes an inductor device comprising:
an inductor core layer;
a plurality of via interconnects traveling through the inductor core layer;
a plurality of interconnects coupled to the plurality of via interconnects; and
at least one dielectric layer coupled to the inductor core layer.

18. The package of claim 13, wherein the capacitor device comprises:
a plurality of interconnects coupled to the second capacitor metal layer,
wherein the at least one capacitor device dielectric layer of the capacitor device is different from the encapsulation layer of the substrate, and
wherein the at least one capacitor device dielectric layer surrounds the first capacitor metal layer, the insulator layer and the second capacitor metal layer.

19. The package of claim 13, wherein the substrate further comprises:
a second capacitor device located in the encapsulation layer; and
a second inductor located in the encapsulation layer,
wherein the inductor, the capacitor device, the second inductor, and the second capacitor device are configured to be electrically coupled together to operate as elements of a matching network for the power amplifier, and
wherein the capacitor device and the second capacitor device are configured to be coupled to ground.

20. The package of claim 19, wherein the inductor and/or the second inductor are each an inductor device.

21. An apparatus comprising:
means for encapsulation;
means for capacitance located in the means for encapsulation, wherein the means for capacitance comprises:
a capacitor substrate;
a first capacitor metal layer;
an insulator layer coupled to the first capacitor metal layer;
a second capacitor metal layer coupled to the insulator layer such that the insulator layer is located between the first capacitor metal layer and the second capacitor metal layer; and
at least one capacitor device dielectric layer;
means for inductance located in the means for encapsulation;
at least one first dielectric layer coupled to a first surface of the means for encapsulation; and
a plurality of first interconnects coupled to the first surface of the means for encapsulation,
wherein the plurality of first interconnects is located at least in the at least one first dielectric layer, and wherein the plurality of first interconnects is coupled to the means for capacitance and the means for inductance.

22. The apparatus of claim 21, further comprising:
at least one second dielectric layer coupled to a second surface of the means for encapsulation; and
a plurality of second interconnects coupled to the second surface of the means for encapsulation, wherein the plurality of second interconnects is located at least in the at least one second dielectric layer.

23. The apparatus of claim 22, further comprising a plurality of vias interconnects located in the means for encapsulation.

24. The apparatus of claim 23, wherein the means for inductance is defined by interconnects from the plurality of via interconnects, the plurality of first interconnects and the plurality of second interconnects.

25. The apparatus of claim 21, wherein the means for inductance comprises:
an inductor core layer;
a plurality of via interconnects traveling through the inductor core layer;
a plurality of interconnects coupled to the plurality of via interconnects; and
at least one dielectric layer coupled to the inductor core layer.

26. The apparatus of claim 21, wherein the at least one capacitor device dielectric layer of the means for capacitance is different from the encapsulation layer of the substrate.

27. The apparatus of claim 21,
wherein the means for inductance and the means for capacitance are configured to be electrically coupled together to operate as elements of a matching network for means for power amplification, and
wherein the means for capacitance is configured to be coupled to ground.

28. The apparatus of claim 21, further comprising:
means for second capacitance located in the means for encapsulation; and
means for second inductance located in the means for encapsulation,
wherein the means for inductance, the means for capacitance, the means for second inductance, and the means for second capacitance are configured to be electrically coupled together to operate as elements of a matching network for a means for power amplification, and
wherein the means for capacitance and the means for second capacitance are configured to be coupled to ground.

* * * * *